(12) United States Patent
Cho et al.

(10) Patent No.: US 11,984,513 B2
(45) Date of Patent: May 14, 2024

(54) CHARGE TRAPPING NON-VOLATILE ORGANIC MEMORY DEVICE

(71) Applicant: KOREA ADVANCED INSTITUTE OF SCIENCE AND TECHNOLOGY, Daejeon (KR)

(72) Inventors: Byung Jin Cho, Daejeon (KR); Min Ju Kim, Daejeon (KR); Eui Joong Shin, Gyeonggi-do (KR); Jae Joong Jung, Gyeonggi-do (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 330 days.

(21) Appl. No.: 17/501,405

(22) Filed: Oct. 14, 2021

(65) Prior Publication Data
US 2022/0115543 A1    Apr. 14, 2022

(30) Foreign Application Priority Data

Oct. 14, 2020  (KR) .................. 10-2020-0132477
Oct. 13, 2021  (KR) .................. 10-2021-0136025

(51) Int. Cl.
*H10K 10/46*   (2023.01)
*H01L 29/423*  (2006.01)
*H01L 29/792*  (2006.01)

(52) U.S. Cl.
CPC ........ *H01L 29/792* (2013.01); *H01L 29/4234* (2013.01); *H10K 10/46* (2023.02)

(58) Field of Classification Search
CPC .... H01L 29/792; H01L 29/4234; H10K 10/46
See application file for complete search history.

(56) References Cited

U.S. PATENT DOCUMENTS

2010/0135937 A1*  6/2010  O'Brien ............... C01B 13/32
                                                257/532
2013/0242220 A1*  9/2013  Chang ................. H01L 29/7869
                                                257/43

(Continued)

FOREIGN PATENT DOCUMENTS

CN       103606627 A  *  2/2014  ........... H01L 51/424
CN       106684244 A  *  5/2017  ......... H01L 51/0003

(Continued)

OTHER PUBLICATIONS

Chang et al., "A flexible organic pentacene nonvolatile memory based on high-k dielectric layers", Applied Physics Letters 93, 233302 (2008), American Institute of Physics, 3 pp.

(Continued)

*Primary Examiner* — Mohammad M Choudhry
(74) *Attorney, Agent, or Firm* — NIXON PEABODY LLP

(57) ABSTRACT

A charge trapping non-volatile organic memory device according to the present invention has a structure in which an organic matter-based blocking layer, a trapping layer, and a tunneling layer are sequentially positioned between a gate and an organic semiconductor layer positioned on an insulating substrate, the trapping layer including a metal oxide and a polymer, and has an organic-inorganic composite film in which the metal oxide is dispersed in a polymer matrix in units of atoms.

16 Claims, 15 Drawing Sheets

(56) References Cited

U.S. PATENT DOCUMENTS

| | | | | |
|---|---|---|---|---|
| 2015/0179820 A1* | 6/2015 | Kim | ................... | H01L 21/0228 |
| | | | | 438/287 |
| 2016/0126329 A1* | 5/2016 | Vellaisamy | ....... | H01L 29/42324 |
| | | | | 438/591 |
| 2021/0226071 A1* | 7/2021 | Salahuddin | .......... | H01L 29/517 |

FOREIGN PATENT DOCUMENTS

| | | | | |
|---|---|---|---|---|
| KR | 20110086052 A | | 7/2011 | |
| KR | 10-2015-0072286 A | | 6/2015 | |
| KR | 20180130885 A | | 12/2018 | |
| WO | WO-2007026586 A1 * | | 3/2007 | ......... H01L 51/0003 |

OTHER PUBLICATIONS

Wang et al., "Highly Reliable Top-Gated Thin Film Transistor Memory with Semiconducting, Tunneling, Charge-Trapping, and Blocking Layers All of Flexible Polymers", ACS Applied Material & Interfaces 2015, 7, pp. 10957-10965.

KR Office Action for Application No. 10-2021-0136025, dated Jun. 20, 2023 (with English translation 11pp).

Korean Office Action for App. No. 0136025, dated Oct. 13, 2021 (12 pages) [English Translation].

Shih et al., "High performance transparent transistor memory devices using nano-floating gate of polymer/ZnO nanocomposites." Scientific Reports 6.1: 20129 (2016).

* cited by examiner

CHARGE TRAPPING NON-VOLATILE ORGANIC MEMORY DEVICE

CROSS-REFERENCE TO RELATED APPLICATIONS

This application claims priority under 35 U.S.C. § 119 to Korean Patent Application No. 10-2020-0132477, filed on Oct. 14, 2020, and Korean Patent Application No. 10-2021-0136025, filed on Oct. 13, 2021, in the Korean Intellectual Property Office, the disclosure of which is incorporated herein by reference in its entirety.

TECHNICAL FIELD

The following disclosure relates to a charge trapping non-volatile organic memory device, and more particularly, to a charge trapping organic memory device that exhibits high performance and high reliability and maintains its performance even in a flexible state.

BACKGROUND

The conventional organic matter-based charge trapping non-volatile memory device is implemented in two methods. The first method is a method of confining charges between insulating films by inserting metal nanoparticles or metal thin film layers and electrically floating the nanoparticles or thin film layers, and the second method is a method of realizing memory by bonding different types of insulating films to trap charges in an electret method.

The most important considerations in flexible organic matter-based memory devices are high reliability of the device and suppression of interference. The method of inserting the metal thin film layer between the insulating layers has a problem in that the trapped charges move in a horizontal direction due to high electric mobility of the metal thin film layer, and therefore, the insulating layer needs to be inserted between the respective memory devices.

In order to solve this problem, a method of inserting metal nanoparticles into a charge trapping layer has been proposed. However, the method has limitations in commercial applications requiring mass production because a highly controlled process is required due to an ultra-fine structure and it is very difficult to uniformly control the size and dispersion of nanoparticles.

The electret method in which heterogeneous insulating films are bonded has the advantage in that the process is easier and the performance is more excellent than the method using nanoparticles, but has a problem in that memory properties are easily lost over time because a binding force of charges trapped in defects formed at an interface of different types of layers is weak.

Therefore, it is necessary to develop a charge trapping non-volatile organic memory device that can be mass-produced in a flexible and simple process and has high performance and high reliability.

RELATED ART DOCUMENT

[Patent Document]
Korean Patent Laid-Open Publication No. 10-2011-0086052

SUMMARY

An embodiment of the present invention is directed to a non-volatile organic memory device having high reliability.

Another embodiment of the present invention is directed to a high-performance non-volatile organic memory device having a wide voltage window.

Still another embodiment of the present invention is directed to a non-volatile organic memory device that is commercially available because it is based on a simple deposition process and can be mass-produced reproducibly.

In one general aspect, a charge trapping non-volatile organic memory device includes: an organic-inorganic composite film, in which a metal oxide is dispersed in a polymer matrix, as a trapping layer for trapping charges.

In the organic-inorganic composite film, metal of the metal oxide may be bonded to the polymer via oxygen, and dispersed in units of atoms.

The charge trapping non-volatile organic memory device may further include: a stacked structure in which an organic blocking layer, the trapping layer, an organic-based tunneling layer, and an organic semiconductor layer are sequentially stacked.

The charge trapping non-volatile organic memory device may further include: a source, a drain, and an upper gate formed on the organic semiconductor layer; and a lower gate formed under the blocking layer.

In an energy band diagram with an energy level (eV) of electron in a vacuum as a reference (0 eV), a lowest unoccupied molecular orbital (LUMO) energy level of the blocking layer and a LUMO energy level of the tunneling layer may each be higher than that of the trapping layer.

In the energy band diagram, a highest occupied molecular orbital (HOMO) energy level of the blocking layer and a HOMO energy level of the tunneling layer may each be lower than that of the trapping layer.

A difference between the LUMO energy level of the blocking layer or the LUMO energy level of the tunneling layer and the LUMO energy level of the trapping layer may be 0.5 eV or higher.

The difference between the HOMO energy level of the blocking layer or the HOMO energy level of the tunneling layer and the HOMO energy level of the trapping layer may be 0.2 eV or higher.

Based on the smaller bandgap energy of the bandgap energy of the blocking layer and the bandgap energy of the tunneling layer, a difference between the bandgap energy as a reference and the bandgap energy of the trapping layer may be 1.0 eV or higher.

The blocking layer is a second organic-inorganic composite film in which a second metal oxide is dispersed in a second polymer matrix.

The dielectric constant of the blocking layer (based on 1 kHz) may be 1.5 to 6 times the dielectric constant of the tunneling layer (based on 1 kHz).

A dielectric constant (based on 1 kHz) of the trapping layer may be greater than that (based on 1 kHz) of the tunneling layer.

The charge trapping non-volatile organic memory device may have retention satisfying the following Equation 1.

$$70\% \leq MW(t)/MW(0)*100 \qquad \text{[Equation 1]}$$

In Equation 1, MW(0) is an initial memory window (V) of the charge trapping nonvolatile organic memory device under 300K, and MW(t) is a memory window at $10^4$ sec.

The charge trapping non-volatile organic memory device may satisfy the following Equations 2 and 3.

$$90\% \leq V_{Th}(T2,0)/V_{Th}(T1,0)*100 \qquad \text{[Equation 2]}$$

In Equation 2, $V_{Th}(T1, 0)$ is an initial threshold voltage at which the charge trapping nonvolatile organic memory device is programmed under 300K, and $V_{Th}$(T2, 0) is an initial threshold voltage at which the charge trapping non-volatile organic memory device is programmed under 360K.

$$(V_{Th}(T1,t)-(V_{Th}(T2,t))/V_{Th}(T1,0)*100 \leq 20\% \quad \text{[Equation 3]}$$

In Equation 3, $V_{Th}$(T1, 0) is the same as the definition of Equation 2, $V_{Th}$(T1, t) is a threshold voltage at $10^4$ sec under 300K of the charge trapping non-volatile organic memory device programmed with $V_{Th}$(T1, 0), and $V_{Th}$(T2, t) is a threshold voltage at $10^4$ sec under 360K of the charge trapping non-volatile organic memory device programmed with $V_{Th}$(T2, 0) in Equation 2.

The charge trapping non-volatile organic memory device may have deformation reliability satisfying the following Equations 4 and 5.

$$85\% \leq V_{Th}(S,0))/V_{Th}(0,0)*100 \quad \text{[Equation 4]}$$

In Equation 4, $V_{Th}$(0, 0) is an initial threshold voltage, at which the charge trapping non-volatile organic memory device is programmed, under 300K and 0% strain, and $V_{Th}$(S, 0) is an initial threshold voltage, at which the charge trapping non-volatile organic memory device is programmed, under 300K and 2% strain.

$$(V_{Th}(0,t)-(V_{Th}(S,t))/V_{Th}(0,0)*100 \leq 20\% \quad \text{[Equation 5]}$$

In Equation 5, $V_{Th}$(0, 0) is the same as the definition of Equation 4, $V_{Th}$(0, t) is a threshold voltage at $10^4$ sec under 300K and 0% strain of the charge trapping non-volatile organic memory device programmed with $V_{Th}$(0, 0), and $V_{Th}$(S, t) is a threshold voltage at $10^4$ sec under 300K and 2% strain of the charge trapping non-volatile organic memory device programmed with $V_{Th}$(S, 0) in Equation 4.

In the organic-inorganic composite, electrical properties including a HOMO energy level, a LUMO energy level, and bandgap energy and physical properties including a dielectric constant of the trapping layer may be controlled by a content of the metal oxide.

The metal of the metal oxide may be one or two or higher selected from hafnium, titanium, and zirconium.

The metal of the second metal oxide may include aluminum.

The polymer may include a hydroxyl group.

DETAILED DESCRIPTION OF EMBODIMENTS

Figure 1:
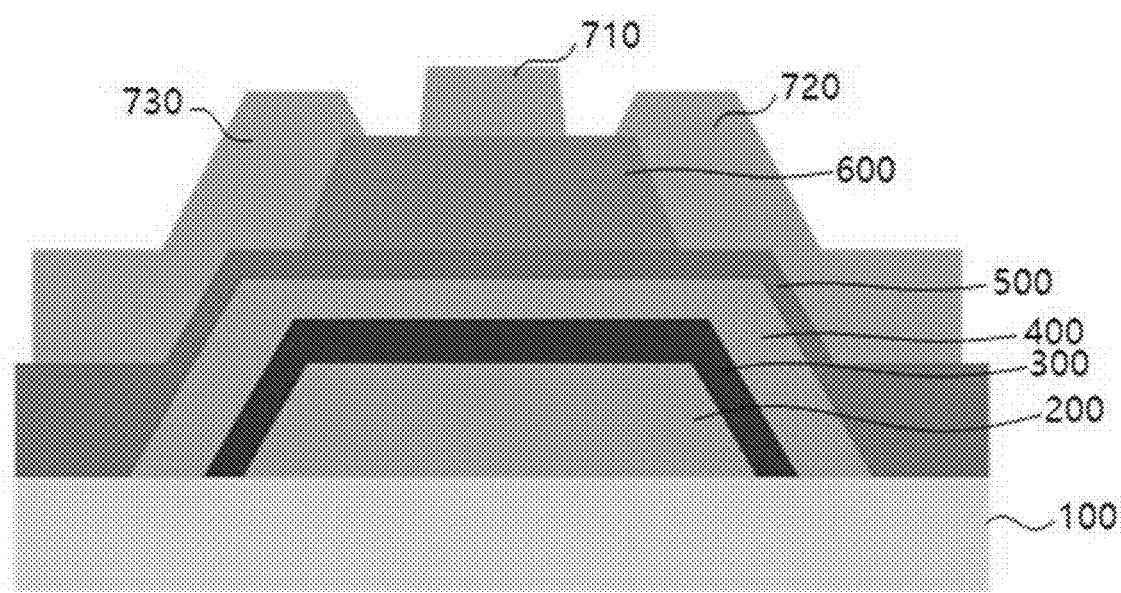
FIG. 1 is a cross-sectional view illustrating a cross section of a charge trapping non-volatile organic memory device according to an embodiment of the present invention.

Hereinafter, a charge trapping non-volatile organic memory device of the present invention will be described in detail with reference to the accompanying drawings. Drawings to be provided below are provided by way of example so that the spirit of the present invention may be sufficiently transferred to those skilled in the art. Therefore, the present invention is not limited to the accompanying drawings provided below, but may be modified in many different forms. In addition, the accompanying drawings suggested below will be exaggerated in order to clear the spirit and scope of the present invention. Technical terms and scientific terms used in the present specification have the general meaning understood by those skilled in the art to which the present invention pertains unless otherwise defined, and a description for the known function and configuration unnecessarily obscuring the gist of the present invention will be omitted in the following description and the accompanying drawings.

In addition, a singular form used in the specification and the appended claims may be intended to include a plural form unless otherwise indicated in the context.

In this specification and the appended claims, terms such as first, second, etc. are used for the purpose of distinguishing one component from another, not in a limiting sense.

In this specification and the appended claims, the terms "include" or "have" means that features or elements described in the specification are present, and unless specifically limited, and do not preclude the possibility that one or higher other features or components may be added unless specifically limited.

In this specification and the appended claims, a case in which a part of a film (layer), a region, a component, etc. is above or on another part includes not only a case in which the part is directly on another part in contact with another part, but also a case in which another film (layer), another region, another component, etc. is interposed therebetween.

A charge trapping non-volatile organic memory device according to the present invention includes an organic-inorganic composite film, in which a metal oxide is dispersed in a polymer matrix, as a trapping layer for trapping charges. In the organic-inorganic composite film (hereinafter referred to as an organic-inorganic composite film), the metal oxide may be uniformly dispersed in the polymer matrix, and may be homogeneously dispersed in units of metal-based atoms of the metal oxide.

Specifically, in the organic-inorganic composite film, the metal of the metal oxide may be bonded to the polymer of the matrix via oxygen, so the metal oxide may be dispersed in units of atoms. Accordingly, the metal oxide uniformly dispersed in the polymer matrix in units of metal-based atoms may be an oxidized metal in a state in which the metal is bonded to the polymer through the oxygen. In this aspect, the metal oxide may also be referred to as the oxidized metal. The oxygen as a medium may be derived from an oxygen-containing functional group of the polymer. The metal may be atomically uniformly dispersed by bonded to the oxygen-containing functional group present in the polymer matrix. In this case, the bond may be a coordination bond, a covalent bond, or an ionic bond. The oxygen-containing functional group may include a hydroxyl group.

In one specific embodiment, the charge trapping non-volatile organic memory device may include a stacked structure (laminate) in which an organic blocking layer, a trapping layer including an organic-inorganic composite film, an organic-based tunneling layer, and an organic semiconductor layer are sequentially stacked. In addition, the charge trapping non-volatile organic memory device may include a source, a drain, and an upper gate formed on the organic semiconductor layer, and may include a lower gate formed under the blocking layer. In this case, the lower gate may be supported by an insulating substrate.

Accordingly, in the charge trapping non-volatile organic memory device according to one specific embodiment, an organic matter-based blocking layer, a trapping layer including an organic-inorganic composite film, and an organic matter-based tunneling layer may be sequentially positioned between a lower gate positioned on the insulating substrate and the organic semiconductor layer, one surface of the organic semiconductor layer may be in contact with the tunneling layer, and the source and drain spaced apart from and opposed to each other with the upper gate interposed therebetween may be positioned over an opposite surface of one surface of the organic semiconductor layer.

The charge trapping non-volatile organic memory device according to the present invention includes the organic-inorganic composite film as the trapping layer in which the metal oxide may be dispersed in the polymer matrix in units of atoms (units of metal-based atoms of the metal oxide) and the metal (metal of the metal oxide) is bonded to the polymer through the oxygen (oxygen of the metal oxide) to control a content of the metal oxide in the organic-inorganic composite, thereby easily controlling electrical properties such as a bandgap energy level, a HOMO energy level, and a LUMO energy level. More specifically, by linearly controlling the content of the metal oxide in the organic-inorganic composite, the electrical properties may also be linearly controlled.

Therefore, by the content of the metal oxide in the organic-inorganic composite, it is possible to implement an energy band structure in which charges trapped in the trapping layer are trapped in an energy barrier (electrical energy barrier) provided by the blocking layer and the tunneling layer. As a result, the charges trapped in the trapping layer may be stably trapped for a long period of time, and thus, long-term reliability may be secured.

More specifically, in the charge trapping non-volatile organic memory device, in an energy band diagram with an energy level (eV) of electron in a vacuum as a reference (0 eV), a lowest unoccupied molecular orbital (LUMO) energy level of the blocking layer and a LUMO energy level of the tunneling layer may each be higher than a LUMO energy level of the trapping layer. Also, in the charge trapping non-volatile organic memory device, a highest occupied molecular orbital (HOMO) energy level of the blocking layer and a HOMO energy level of the tunneling layer may each be lower than that of the trapping layer. In this case, it goes without saying that as the energy level of electrons in the vacuum is referenced, a high work energy level means having a larger value based on a negative number, and having a smaller value based on an absolute value.

For example, when the trapped charges are electrons, the trapped electrons may be stably trapped for a long period of time by an energy barrier formed by a difference between the LUMO energy level of the trapping layer and the high LUMO energy level of the blocking layer, and a difference between the LUMO energy level of the trapping layer and the LUMO energy level of the tunneling layer. In detail, the electrons trapped in the trapping layer may be confined by the energy barrier corresponding to the difference between the LUMO energy level of the trapping layer and the high LUMO energy level of the blocking layer, for the blocking layer, and may be confined by the energy barrier corresponding to the difference between the LUMO energy level and the LUMO energy level of the tunneling layer, for the tunneling layer.

As a substantial example, the difference between the LUMO energy level of the blocking layer or the LUMO energy level of the tunneling layer and the LUMO energy level of the trapping layer may be 0.5 eV or higher, 0.6 eV or higher, or 0.7 eV or higher, and may be substantially 4.0 eV or lower. That is, the size of the energy barrier confining the trapped electrons may be 0.5 eV or higher, 0.6 eV or higher, or 0.7 eV or higher, and may be substantially 4.0 eV or lower. Due to this energy barrier, even in a high-temperature environment of 360 K, the electrons trapped in the trapping layer may be firmly confined inside the trapping layer without escaping to the outside of the trapping layer.

Further, since the highest occupied molecular orbital (HOMO) energy level of the blocking layer and the HOMO energy level of the tunneling layer are each lower than that of the trapping layer, holes present in the trapping layer are also trapped by the energy barrier, so a threshold voltage of the memory device set by a program or erase can be maintained more stably.

As a substantial example, the difference between the HOMO energy level of the blocking layer or the HOMO energy level of the tunneling layer and the HOMO energy level of the trapping layer may be 0.2 eV or higher, and may be substantially 1.5 eV or lower, but is not necessarily limited thereto.

As a substantial example, based on the smaller bandgap energy of the bandgap energy of the blocking layer and the bandgap energy of the tunneling layer, the difference between the bandgap energy as the reference and the bandgap energy of the trapping layer may be 1.0 eV or higher, and may be substantially 4.5 eV or lower.

However, the memory device according to the present invention may not be necessarily limited to a p-type organic semiconductor-based memory device in which electrons of an organic semiconductor channel pass through a tunneling layer (FN tunneling) and are trapped and confined in the trapping layer. As described above, as the holes of the trapping layer are also confined by the energy barrier, it is obvious that an n-type organic semiconductor-based memory device in which the channel holes of the n-type organic semiconductor are trapped and confined in the trapping layer also falls within the scope of the present invention.

In one specific embodiment, similarly to the trapping layer, the blocking layer may also be an organic-inorganic composite (second organic-inorganic composite) film. In detail, the blocking layer may be a second organic-inorganic composite film (hereinafter, referred to as a second organic-inorganic composite film) in which the second metal oxide is dispersed in a second polymer serving as a matrix. In the second organic-inorganic composite film, the second metal oxide based on the metal of the metal oxide may be dispersed in the second polymer in units of atoms, and the metal (second metal) of the second metal oxide may be a film bonded to the second polymer via oxygen. The second metal oxide uniformly dispersed in the second polymer in units of metal (second metal)-based atoms may be an oxidized metal (oxidized second metal) in a state in which the second metal is bonded to the second polymer via oxygen. In this aspect, the second metal oxide may also be referred to as the oxidized second metal. Similarly, the oxygen as a medium may be derived from an oxygen-containing functional group of the polymer.

As described above, the organic-inorganic composite may linearly control electrical properties by changing the content of the metal oxide linearly, so it is possible to easily implement a blocking layer providing a targeted energy barrier.

Furthermore, the composite in which the metal oxide is dispersed in the second polymer matrix in units of atoms, and the metal of the second metal oxide is bonded to the second polymer via oxygen may not only have a higher dielectric constant compared to the conventional organic matter, but may also increase the dielectric constant through the content of the metal oxide.

In a case of the dielectric constant of the trapping layer, preferably, in a case in which the trapping layer and the blocking layer are a high-K material with a large dielectric constant, bending of an electrical band is relieved when an electrical signal is applied for program or erase, and as a result, it is advantageous in that back-tunneling of charges may be prevented, the bending of the electric band may be concentrated on the tunneling layer, and more effective FN tunneling may occur.

As a specific example, the dielectric constant of the blocking layer, which is the second organic-inorganic composite film, may be 1.5 to 6 times, specifically, 2 to 5 times, more specifically 2.5 to 4 times the dielectric constant of the tunneling layer. Substantially, the dielectric constant of the blocking layer may be 3.5 to 7.

Specifically, the dielectric constant of the trapping layer, which is the organic-inorganic complex (the first organic-inorganic complex) film, may be greater than the dielectric constant of the tunneling layer, specifically 1.5 to 7 times, more specifically 2 to 7 times, and particularly specifically 3 to 6 times. Substantially, the dielectric constant of the trapping layer may be 3.5 to 12. In this case, the dielectric constant of the tunneling layer may be in the range of 1.2 to 2.3, but is not necessarily limited thereto.

FIG. 1 is a cross-sectional view illustrating a cross section of a charge trapping non-volatile organic memory device according to an embodiment of the present invention. As in one example illustrated in FIG. 1, the non-volatile organic memory device may include an insulating substrate 100, a lower gate 200 positioned on the insulating substrate, and an organic blocking layer 300, an organic matter-based trapping layer 400, an organic matter-based tunneling layer 500, and an organic semiconductor layer 600 that are sequentially stacked on the lower gate 200, and an upper gate 710 positioned in a space between a source and a drain 720 and 730 spaced apart from and opposed to each other may be positioned on the organic semiconductor layer 600. The organic blocking layer may have a thickness of 5 to 30 nm level, specifically 10 to 20 nm, the trapping layer may have a thickness of 1 to 10 nm level, specifically 2 to 8 nm, and the tunneling layer is a thickness of 1 to 8 nm level, specifically 1 to 6 nm, but is not limited thereto.

As the insulating substrate 100, any insulator that physically and stably supports the stacked structure including the lower gate 200 to the upper gate 710 and does not electrically affect the use of the memory device may be used. For example, the insulating substrate may be a rigid substrate or a flexible substrate, and may be a flexible substrate in terms of not impairing the flexibility of the non-volatile organic memory device. As a substantial example, the rigid substrate may be a glass substrate, and the flexible substrate is polyethylene terephthalate (PET), polyethylene naphthalate (PEN), polyimide (PI), polycarbonate (PC), polypropylene (PP), triacetyl cellulose (TAC), polyethersulfone (PES), or the like, but it goes without saying that the present invention is not limited to a spherical material of the insulating substrate.

The lower gate 200 may be a conductor, for example, a metal such as any one or more of Al, Au, Ti, and Pd, but is not limited thereto.

The blocking layer 300 has bandgap energy greater than that of the trapping layer 400, and may be made of an organic-based material that satisfies the above-described energy band diagram, but is preferably the second organic-inorganic composite film described above in terms of easy electrical property control and high dielectric constant implementation. As a specific example, the blocking layer 300 may be a second organic-inorganic composite film containing a polymer (second polymer) matrix polymerized from a monomer having one or more vinyl groups and hydroxyl groups and a second metal oxide (oxidized second metal), and the second organic-inorganic composite film may contain 10 to 20 atomic % of metal based on the metal (second metal) of the second metal oxide. The polymer of the blocking layer 300 may be an insulating polymer. As a substantial example, the polymer of the blocking layer may be an acrylic polymer (also referred to as a (meth)acrylic polymer). The acrylic polymer may mean a polymer containing a structural unit derived from an alkyl (meth) acrylate as a main component, preferably a polymer containing a hydroxyalkyl (meth) acrylate as a main component. In this case, (meth) acrylate means acrylate and/or methacrylate. Examples of the alkyl (meth) acrylate constituting a main skeleton of the (meth) acrylic polymer include linear or branched C1-C18 (meth) acrylate. Specific examples of the C1-C18 alkyl group may include a methyl group, an ethyl group, a propyl group, an isopropyl group, a butyl group, an isobutyl group, an amyl group, a hexyl group, a cyclohexyl group, a heptyl group, a 2-ethylhexyl group, an isooctyl group, a nonyl group, a decyl group, an isodecyl group, a dodecyl group, an isomyristyl group, a lauryl group, a tridecyl group, a pentadecyl group, a hexadecyl group, a heptadecyl group, an octadecyl group, combinations thereof, or the like. In the alkyl (meth) acrylate, the alkyl group may be an alkyl group in which at least a part of hydrogen atoms are substituted with a hydroxyl group.

The trapping layer 400 includes a first metal oxide and a first polymer, and may be a first organic-inorganic composite film in which the first metal oxide is dispersed in a first polymer matrix in units of atoms, and the metal of the first metal oxide is bonded to the first polymer via oxygen, and may satisfy the above-described bandgap energy and the above-described energy band diagram. As a specific example, the trapping layer 400 may be a first organic-inorganic composite film containing a polymer (first polymer) matrix polymerized from a monomer having one or more vinyl groups and hydroxyl groups and oxides (oxidized first metal) of one or more metals selected from hafnium, titanium and zirconium, and the first organic-inorganic composite film may contain 10 to 20 atomic % of metal based on the metal (second metal) of the first metal oxide. The polymer of the trapping layer may be an insulating polymer. As a substantial example, independent of the polymer of the blocking layer, the polymer of the trapping layer may be an acrylic polymer (also referred to as a (meth) acrylic polymer). The acrylic polymer may mean a polymer containing a structural unit derived from an alkyl (meth) acrylate as a main component, preferably a polymer containing a hydroxyalkyl (meth) acrylate as a main component. In this case, (meth) acrylate means acrylate and/or methacrylate. Examples of the alkyl (meth) acrylate constituting a main skeleton of the (meth) acrylic polymer include linear or branched C1-C18 (meth) acrylate. Specific examples of the C1-C18 alkyl group may include a methyl group, an ethyl group, a propyl group, an isopropyl group, a butyl group, an isobutyl group, an amyl group, a hexyl group, a cyclohexyl group, a heptyl group, a 2-ethylhexyl group, an isooctyl group, a nonyl group, a decyl group, an isodecyl group, a dodecyl group, an isomyristyl group, a lauryl group, a tridecyl group, a pentadecyl group, a hexadecyl group, a heptadecyl group, an octadecyl group, combinations thereof, or the like. In the alkyl (meth) acrylate, the alkyl group may be an alkyl group in which at least a part of hydrogen atoms are substituted with a hydroxyl group.

In the manufacturing method, the trapping layer 400 may be the first organic-inorganic composite film in which a first monomer, a first initiator, and a first organometallic precursor are mixed in a gas phase and reacted to form the first metal oxide from the first organometallic precursor, and the first metal oxide is chemically bonded to the first polymer formed while the first monomer is polymerized and dispersed in units of atoms. Similarly, the blocking layer 300 may be the second organic-inorganic composite film in which a second monomer, a second initiator, and a second organometallic precursor are mixed in a gas phase and reacted to form the second metal oxide from the second organometallic precursor, and the second metal oxide is chemically bonded to the second polymer formed while the second monomer is polymerized and dispersed in units of atoms.

The first monomer and the second monomer are monomers activated by an initiator independently of each other to form the polymer matrix and having one or more vinyl groups and hydroxyl groups, in which these monomers may further include a substituent. In this case, the substituent may be any one or two or more of an alkyl group, an ethynyl group, an allyl group, a butyl group, and a phenyl group, and the alkyl group may be a methyl group, an ethyl group, a propyl group, etc., but is not limited thereto.

The initiator is a substance that induces activation for initiation of a reaction so that the monomers may form the polymer. The initiator may be a material capable of forming free radicals by thermal decomposition at a temperature lower than the temperature at which the monomer is thermally decomposed. The initiator is not particularly limited as long as it is a substance capable of activating a monomer as a substance that is decomposed by supply of heat to form the free radicals. For example, the initiator may be a thermal initiator and/or a photoinitiator decomposed by UV or the like. In the case of the thermal initiator, the decomposition temperature of the initiator may be a reaction temperature for depositing the organic-inorganic composite film, and may be, for example, 200 to 300° C., but is not limited thereto.

A ratio of the organic component and the inorganic component inside the film may be easily controlled according to a flow rate of the injected gaseous monomer and the organometallic precursor. Surface growing, in which polymerization occurs by adsorption of monomers and radicals to the surface in the gas phase, is implemented, and a very thin and uniform film of 10 nm or less may be formed by conformal coating. In addition, when two or more monomers are introduced, copolymers having various compositions may be implemented by controlling the introduction flow rate of the monomer and the initiator. Since the type and flow rate of the introduced organometallic compound as well as the monomer may be easily changed, it is easy to control the type and ratio of the metal oxide in the film.

The monomers (first monomer or second monomer) may be polymerized to form a polymer film (polymer matrix). The monomer (the first monomer or the second monomer) may be a monomer including a vinyl group and a hydroxyl group, and specifically may be an acrylate-based and/or methacrylate-based monomer including a vinyl group and a hydroxyl group. The monomer may have a hydroxyl group in a form including an alkyl group in which at least a part of the hydrogen atoms are substituted with a hydroxyl group. As a substantial example, as the monomer (first monomer or second monomer), one or two or more of 2-hydroxyethyl acrylate (HEA), 2-hydroxyethyl methacrylate (HEMA), hydroxypropyl acrylate (HPA), hydroxypropyl methacrylate (HPMA), pentaerythritol triacrylate (PETA), etc. may be used.

The organometallic precursor (the first organometallic precursor or the second organometallic precursor) may be decomposed and oxidized to be atomically dispersed in the polymer matrix in the form of the metal oxide (oxidized metal). In the case of the trapping layer 400, the metal constituting the organometallic precursor may include any one or two or more of Hf, Zr, and Ti. In the case of the blocking layer 300, the metal constituting the organometallic precursor may be Al. In addition, the organic component constituting the organometallic precursor (the first organometallic precursor or the second organometallic precursor) may be a hydrocarbon group bonded to a metal or an amine group substituted with a hydrocarbon group such as an alkyl group. Examples of such organometallic precursors include trimethyl aluminum (TMA), tetrakis(dimethylamido)hafnium (TDMAHf), tetrakis(dimethylamido)zirconium (TDMAZr), tetrakis(dimethylamido)titanium (TDMATi), or the like.

Accordingly, in one aspect of the present invention, the trapping layer and the blocking layer each include a polymer in which a monomer is polymerized, and the polymer (the first polymer or the second polymer) includes a hydroxyl group, and examples of such a polymer may include any one or two or more of pHEA, pHEMA, pHPA, pHPMA, and pPETA.

A peroxide may be used as the initiator (first initiator or second initiator). For example, a peroxide selected from Chemical Formulas 1 to 5 may be used, and preferably, tert-butylperoxide (TBPO) of Chemical Formula 4 may be used. In this case, TBPO is a volatile material having a boiling point of about 110□ C, and is decomposed around 150□ C.

[Chemical Formula 1]

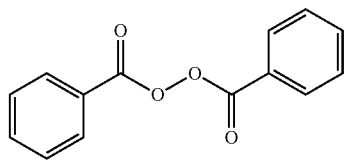

[Chemical Formula 2]

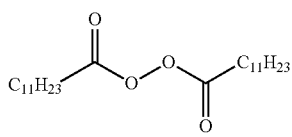

[Chemical Formula 3]

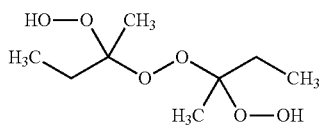

[Chemical Formula 4]

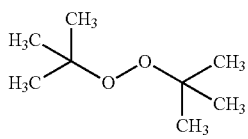

[Chmical Formula 5]

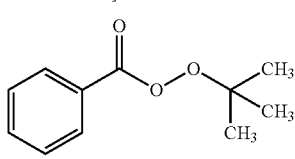

As the initiator (first initiator or second initiator), in addition to substances that are decomposed by heat such as the TBPO to form radicals, a benzophenone-based photoinitiator, a thioxanthone-based photoinitiator, a benzoin-based photoinitiator, a benzoinalkylether-based photoinitiator, which are decomposed by light such as UV to form radicals, may be used. Examples of such a photoinitiator may include any one or two or more of acetophenone, hydroxydimethylacetophenone, dimethylaminoacetophenone, dimethoxy-2-phenylacetophenone, 3-methylacetophenone, 2,2-dimethoxy-2-phenylacetophenone, 2,2-diethoxy-2-phenylacetophenone, 4-chlorocetophenone, 4,4-dimethoxyacetophenone, 2-hydroxy-2-methyl-1-phenylpropan-1-one, 4-hydroxycyclophenylketone, 1-hydroxy cyclohexylphenylketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4-diaminobenzophenone, 4,4'-diethylaminobenzophenone, dichlorobenzophenone, anthraquinone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzoin, benzoin methyl ether, benzoin ethyl ether, benzoin isopropyl ether, benzoin-n-butyl ether, benzoin isobutyl ether, benzyl dimethyl ketal, diphenyl ketone benzyldimethyl ketal, acetophenone dimethyl ketal, p-dimethylaminobenzoic acid ester, 2,4,6-trimethylbenzoyldiphenylphosphine oxide, fluorene, triphenylamine, and carbazole.

Detailed deposition conditions for depositing the blocking layer or the trapping layer by mixing a monomer, an initiator, and an organometallic precursor in a vapor phase may be performed with reference to Korean Patent Laid-Open No. 2018-0130885, etc.

The tunneling layer 500 preferably includes an insulating organic matter that satisfies the above-described energy band diagram, but has as low a dielectric constant as possible. For example, the tunneling layer 500 may include one or more organic matters selected from poly(cyclosiloxane), poly(perfluorodecylacrylate), pFMA (FMA=1H, 1H, 2H, 2H-perfluoroctylmethacrylate), pIBA (IBA isobutyl acrylate), pEGDMA (EGDMA=ethylene glycol dimethacrylate), pV3D3 (V3D3=1,3,5-trivinyl-1,3,5-trimethyl cyclotrisiloxane), and pPFDA (PFDA perfluorodecyl acrylate), but is not necessarily limited thereto.

The organic semiconductor layer 600 may be a p-type organic semiconductor or an n-type organic semiconductor, and may include, for example, any one of pentacene, N,N'-ditridecylperylene-3,4,9,10-tetracarboxylic diimide (PTCDI-C13), [1]benzothieno[3,2-b][1]benzothiophene (BTBT), 2,7-dioctyl[1]benzothieno[3,2-b][1]benzothiophene (C8-BTBT), dinaphtho[2,3-b:2',3'-f]thieno[3,2-b]thiophene (DNTT), polythiophene, polyacetylene, α-hexathienylene, and fullerene (C60), but is not necessarily limited thereto.

The upper gate, source, and drain 710 to 730 may each be a conductor, for example, a metal such as any one or more of Al, Au, Ti, and Pd, and in terms of preventing damage to the lower organic matter (organic semiconductor layer, tunneling layer, etc.) and lowering the contact resistance during the formation of the upper gate, source, and drain, may further include an intermediate layer such as molybdenum oxide or tungsten oxide between the metal electrode of the gate, source, or drain and the lower organic matter layer, but is not necessarily limited thereto.

Describing electron trapping as an example, electrons in the channel of the organic semiconductor layer 600 tunnel through the tunneling layer 500 during a program operation and are trapped in the trapping layer 400, and trapped electrons may be removed by returning to the organic semiconductor layer 600 by tunneling through the tunneling layer 500 during the erase operation.

The charge trapping non-volatile organic memory device according to one specific embodiment has the structure in which the charges trapped in the trapping layer are confined in the energy barrier, has no defects, is homogeneous at an atomic level, suppresses inorganic components (metal oxides) from moving in the horizontal direction by trapping charges in organic matter-based thin films mixed with organic matter (matrix polymers), prevents the inherent flexibility of the polymer from being damaged, and has improved thermal stability and dielectric properties, so it may have a wide threshold voltage window, excellent long-term retention, and improved temperature reliability and deformation reliability.

Specifically, the charge trapping non-volatile organic memory device may have a threshold voltage window of 4V or more, specifically 5V or more, and more specifically 5.5V or more to 7V or less. As a substantial example, the threshold voltage of the memory device may be controlled from −2V to 5V by the program.

Specifically, the charge trapping non-volatile organic memory device may have retention satisfying the following Equation 1.

$$70\% \leq MW(t)/MW(0)*100 \qquad \text{[Equation 1]}$$

In Equation 1, MW(0) is the initial memory window (memory window, V) of the charge trapping non-volatile organic memory device under 300K, and MW(t) is the memory window at 104 sec. In this case, it goes without saying that it is the difference between the initial threshold voltages at which the memory window is programmed/erased. That is, in Equation 1, MW(0) is the initial memory window which is the difference between the initial threshold voltage, at which the charge trapping non-volatile organic memory device is programmed, and the initial threshold voltage, at which the charge trapping non-volatile organic memory device is erased, under 300K, and MW(t) is the memory window at 104 sec under 300K. In Equation 1, MW(t)/MW(0)*100 may be 70% or more, 72% or more, 74% or more, 76% or more, 78% or more, or 80% or more, and is substantially 100% or less, or 95% or less. In this case, MW(0) may be 3V or more, specifically 3.5V or more, more specifically 4.0V or more, even more specifically 4.5V or more, and may be substantially 8V or less.

Specifically, the charge trapping non-volatile organic memory device may have temperature reliability satisfying the following Equations 2 and 3.

$$90\% \leq V_{Th}(T2,0)/V_{Th}(T1,0)*100 \quad \text{[Equation 2]}$$

In Equation 2, $V_{Th}(T1, 0)$ is an initial threshold voltage, at which the charge trapping non-volatile organic memory device is programmed, under 300K, and $V_{Th}(T2, 0)$ is an initial threshold voltage, at which the charge trapping non-volatile organic memory device is programmed, under 360K. In this case, $V_{Th}(T1, 0)$ and $V_{Th}(T2, 0)$ may be programmed under the same conditions except for temperature, and $V_{Th}(T1, 0)$ may be at a level of 3 to 4V. Substantially, $V_{Th}(T2, 0))/V_{Th}(T1, 0)$ may be 90% or more, 91% or more, 92% or more, 93% or more, 94% or more, or 95% or more, and may be 100% or less.

$$(V_{Th}(T1,t)-(V_{Th}(T2,t))/V_{Th}(T1,0)*100 \leq 20\% \quad \text{[Equation 3]}$$

In Equation 3, $V_{Th}(T1, 0)$ is the same as the definition of Equation 2, and $V_{Th}(T1, t)$ is the threshold voltage at 104 sec, at which the charge trapping non-volatile organic memory device is programmed with $V_{Th}(T1, 0)$, under 300K, and $V_{Th}(T2, t)$ is the threshold voltage at 104 sec, at which the charge trapping non-volatile organic memory device is programmed with $V_{Th}(T2, 0)$, under 300K Substantially, $(V_{Th}(T1, t)-(V_{Th}(T2, t))/V_{Th}(T1, 0)*100$ may be 20% or less, 18% or less, 16% or less, 14% or less, 12% or less, or 11% or less, and may be 0% or more.

The temperature reliability of Equations 2 and 3 means that the setting of the memory device by program and erase and the maintenance of the set value are stably performed even in a high-temperature environment of up to 360K, and the deterioration of the memory characteristics due to the temperature substantially almost no occurs.

Specifically, the charge trapping non-volatile organic memory device may have the deformation reliability satisfying the following Equations 4 and 5.

$$85\% \leq V_{Th}(S,0))/V_{Th}(0,0) \quad \text{[Equation 4]}$$

(In Equation 4, $V_{Th}(0, 0)$ is an initial threshold voltage, at which the charge trapping non-volatile organic memory device is programmed, under 300K and 0% strain, and $V_{Th}(S, 0)$ is an initial threshold voltage, at which the charge trapping non-volatile organic memory device is programmed, under 300K and 2% strain. In this case, $V_{Th}(S, 0)$ and $V_{Th}(0, 0)$ may be due to the programming under the same conditions except for the physical deformation, and $V_{Th}(0, 0)$ may be at a level of 3 to 4V. Substantially, $V_{Th}(S, 0))/V_{Th}(0, 0)$ may be 85% or more, 87% or more, 89% or more, or 90% or more, and may be 100% or less.

$$(V_{Th}(0,t)-(V_{Th}(S,t))/V_{Th}(0,0)*100 \leq 20\% \quad \text{[Equation 5]}$$

In Equation 5, $V_{Th}(0, 0)$ is the same as the definition of Equation 4, and $V_{Th}(0, t)$ is the threshold voltage at 104 sec, at which the charge trapping non-volatile organic memory device is programmed with $V_{Th}(0, 0)$, under 300K and 0% strain 0%, and $V_{Th}(S, t)$ is the threshold voltage at 104 sec, at which the charge trapping non-volatile organic memory device is programmed with $V_{Th}(S, 0)$ of Equation 4, under 300K and 2% strain. Substantially, $(V_{Th}(0, t)-(V_{Th}(S, t))/V_{Th}(0, 0)*100$ may be 20% or less, 18% or less, 16% or less, 14% or less, 12% or less, 10% or less, or 8% or less, and may be 0% or more. In Equations 4 and 5, 2% strain is a strain (strain=total thickness of device including substrate/radius of curvature*100%) applied by bending both ends of the device around the upper gate in the direction of gravity in the memory device as illustrated in FIG. 1.

Figure 2:
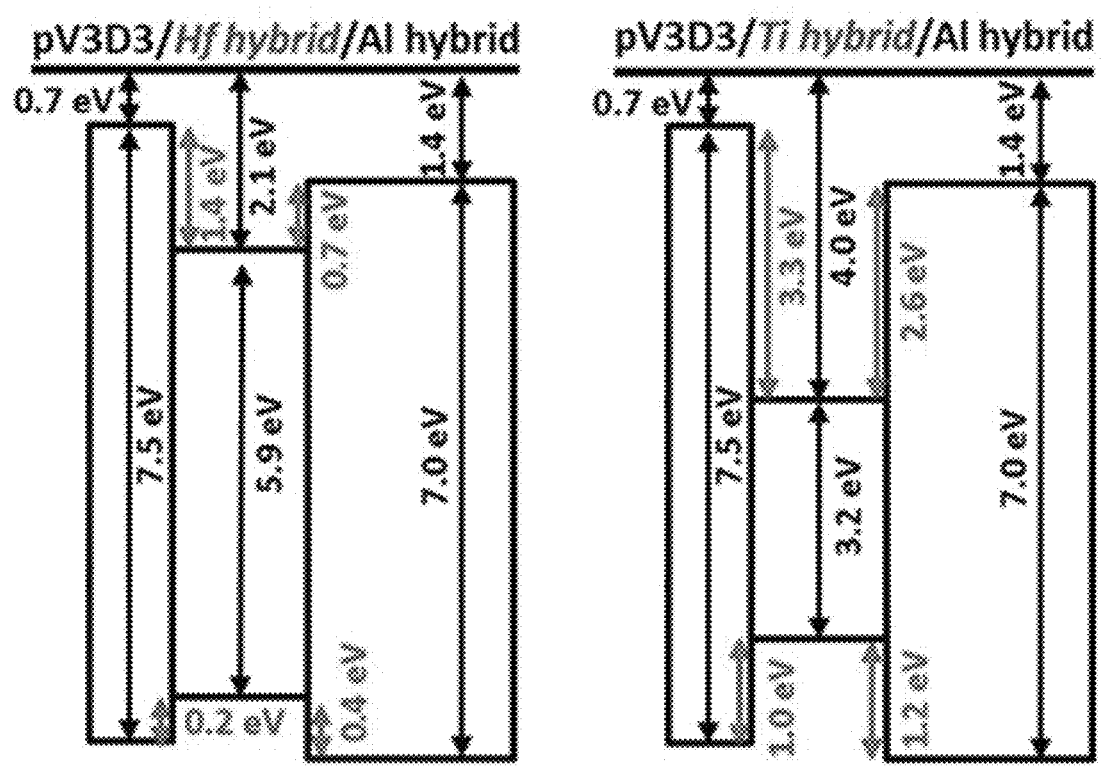
FIG. 2 is a diagram illustrating an energy band diagram of the charge trapping non-volatile organic memory device manufactured according to the embodiment of the present invention.

FIG. 2 is a diagram illustrating an energy band diagram of the charge trapping non-volatile organic memory device manufactured according to the embodiment of the present invention. In detail, the charge trapping non-volatile organic memory device that has the structure corresponding to FIG. 1 and has Polyethylene naphthalate (PEN) film/Al lower gate/blocking layer of the second organic-inorganic composite film (12.8 nm)/trapping layer of the first organic-inorganic composite film (4.0 nm)/tunneling layer of pV3D3 (4.5 nm)/organic semiconductor layer of pentacene (30 nm) or PTCDI-C13 (30 nm)/upper gate, source and drain of $WO_3$—Al or $MoO_3$—Au is illustrated. The blocking layer was prepared by vaporizing HEMA (99%, Aldrich), TMA (99.99%, UP Chemical), and TBPO (99%, Aldrich) and introducing the vaporized HEMA, TMA, and TBPO into a reactor (Daeki Hi-TechCo. Ltd., ISAC Research) for reaction. The HEMA, TMA, and TBPO were heated to 70, 50, and 30° C., respectively, and introduced into the reactor at an injection pressure of 50 mTorr for the HEMA and TBPO and at an injection pressure of 50 mTorr for TMA. The reactor pressure and substrate temperature were maintained at 90 mTorr and 40° C., and the filament temperature of the reactor was maintained at 150° C. to initiate polymerization to deposit a second organic-inorganic composite film (Al content in the film=14.91%) into which aluminum oxide is introduced, and the reaction time is controlled to control the thickness of the film formed by the polymerization. For the trapping layer, TDMAHf, TDMAZr, or TDMATi is used as an organometallic precursor, and the remaining films were deposited under the same conditions as the blocking layer in the state in which the injection pressures of the HEMA and TBPO were 350 mTorr and 100 mTorr, respectively, the flow rate of the organometallic precursor was fixed at 500 mTorr, and the substrate temperature was maintained at 60° C. As a result of analyzing the composition using X-ray photoelectron spectroscopy (XPS), when the first organic-inorganic composite contains hafnium oxide, the content of hafnium (metal) in the film was 15.45 atomic %, and when the first organic-inorganic composite contained zirconium oxide, the content of zirconium (metal) in the film was 16.75 atomic %, and when the first organic-inorganic composite contained titanium oxide, the content of titanium (metal) in the film was 13.39 atomic %. Based on the dielectric constant of 1 kHz at room temperature, the dielectric constant of pV3D3 was 2.2, the dielectric constant of the second organic-inorganic composite film was 5.0, the dielectric constant of the first organic-inorganic composite film into which hafnium oxide was introduced was 7.4, and the dielectric constant of the first organic-inorganic composite film into which titanium oxide was introduced was 6.5. In this case, the electrical properties such as the HOMO energy level and the LUMO energy level of each layer were measured through UV photoelectron spectroscopy (UPS)/reflected electron energy loss spectroscopy (REELS) analysis.

As in the example illustrated in FIG. 2, it can be seen that in the trapping layer, which is the first organic-inorganic composite film into which the hafnium oxide is introduced, an energy barrier of 1.4 eV is formed toward the electron-based tunneling layer, an energy barrier of 0.7 eV is formed toward the blocking layer are formed, an energy barrier of 0.2 eV is formed toward the reference tunneling layer, and an energy barrier of 0.4 eV is formed toward the blocking layer. It can be seen that in the trapping layer, which is the first organic-inorganic composite film into which zirconium oxide is introduced, an energy barrier of 2.1 eV is formed toward the electron-based tunneling layer, an energy barrier of 1.4 eV is formed toward the blocking layer side, an energy barrier of 0 eV is formed toward the hole-based tunneling layer, and an energy barrier of 0.2 eV is formed toward the blocking layer. In addition, it can be seen that in the trapping layer, which is the first organic-inorganic composite film into which titanium oxide is introduced, an energy barrier of 3.6 eV is formed toward the electron-based tunneling layer, an energy barrier of 2.9 eV is formed toward the blocking layer side, an energy barrier of 0.1 eV is formed toward the hole-based tunneling layer, and an energy barrier of 0.3 eV is formed toward the blocking layer.

Figure 3A:
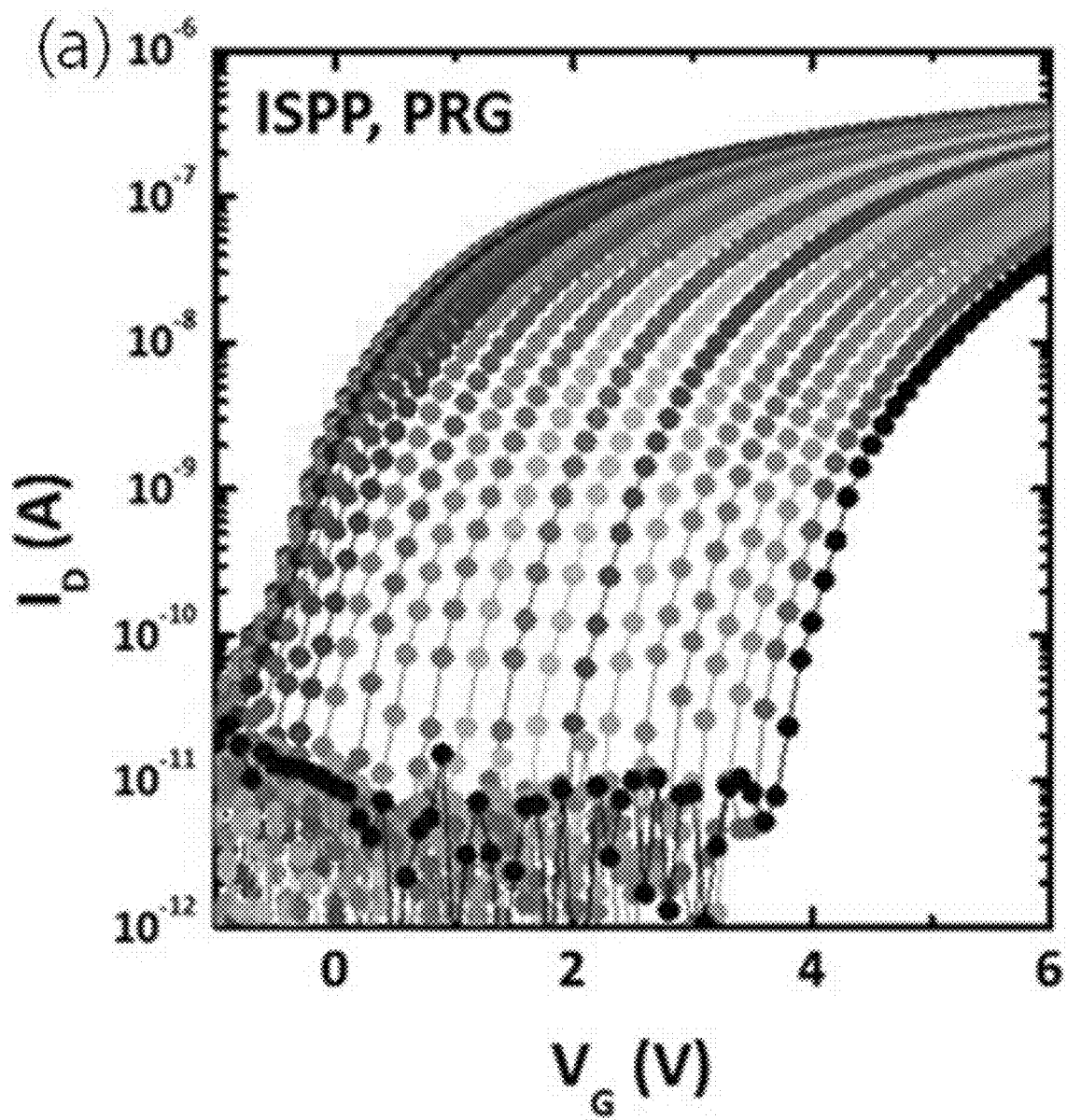
FIGS. 3A and 3B are diagrams illustrating measurement of an I-V transfer curve of the charge trapping non-volatile organic memory device manufactured according to the embodiment of the present invention.
Figure 3B:
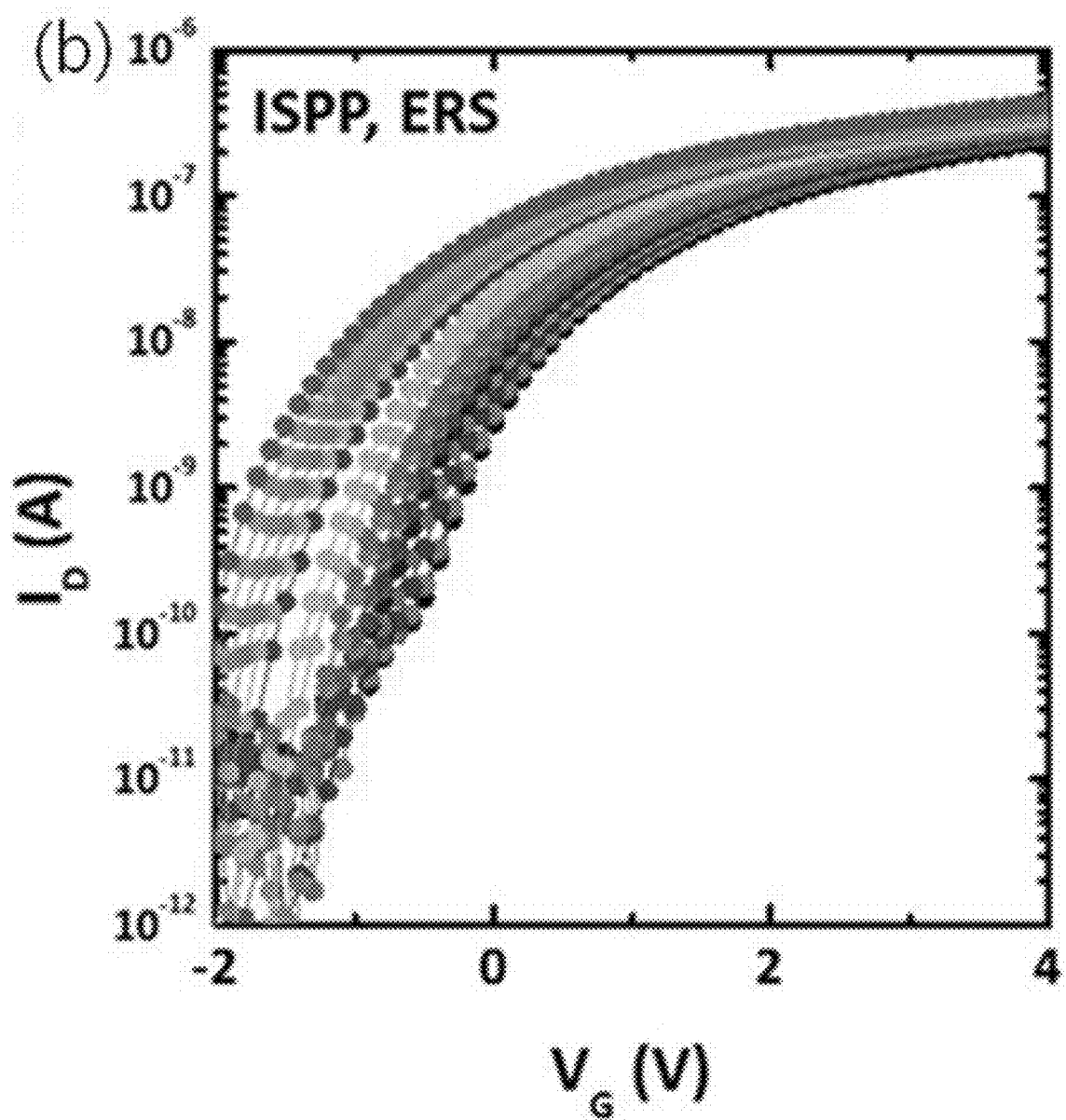

FIGS. 3A and 3B are diagrams illustrating measurement of an I-V transfer curve during the program (FIG. 3A) and the erase (FIG. 3B) using the incremental step pulse programming (ISPP) method of a non-volatile organic memory device having a trapping layer, which is an organic-inorganic composite film into which hafnium oxide is introduced, among non-volatile organic memory devices having the energy band diagram of FIG. 2. In ISPP, ΔV=0.5V, pulse width=3 sec, program voltage=18V, erase voltage=−16V. Unless otherwise specified, the characteristic tests of the non-volatile organic memory device were performed at 300K and the proposed ISPP method. As can be seen from FIGS. 3A and 3B, as programming proceeds, charges are trapped and confined in the trapping layer, and the threshold voltage window reaches 6.1V.

For comparison, instead of the blocking layer of the second organic-inorganic composite film (12.8 nm)/the trapping layer of the first organic-inorganic composite film (4 nm)/the tunneling layer of pV3D3 (4.5 nm), a double-layer memory device having a structure of the second organic-inorganic composite film (12.8 nm)/pV3D3 (4.5 nm) film was manufactured, and memory characteristics were compared.

Figure 4A:
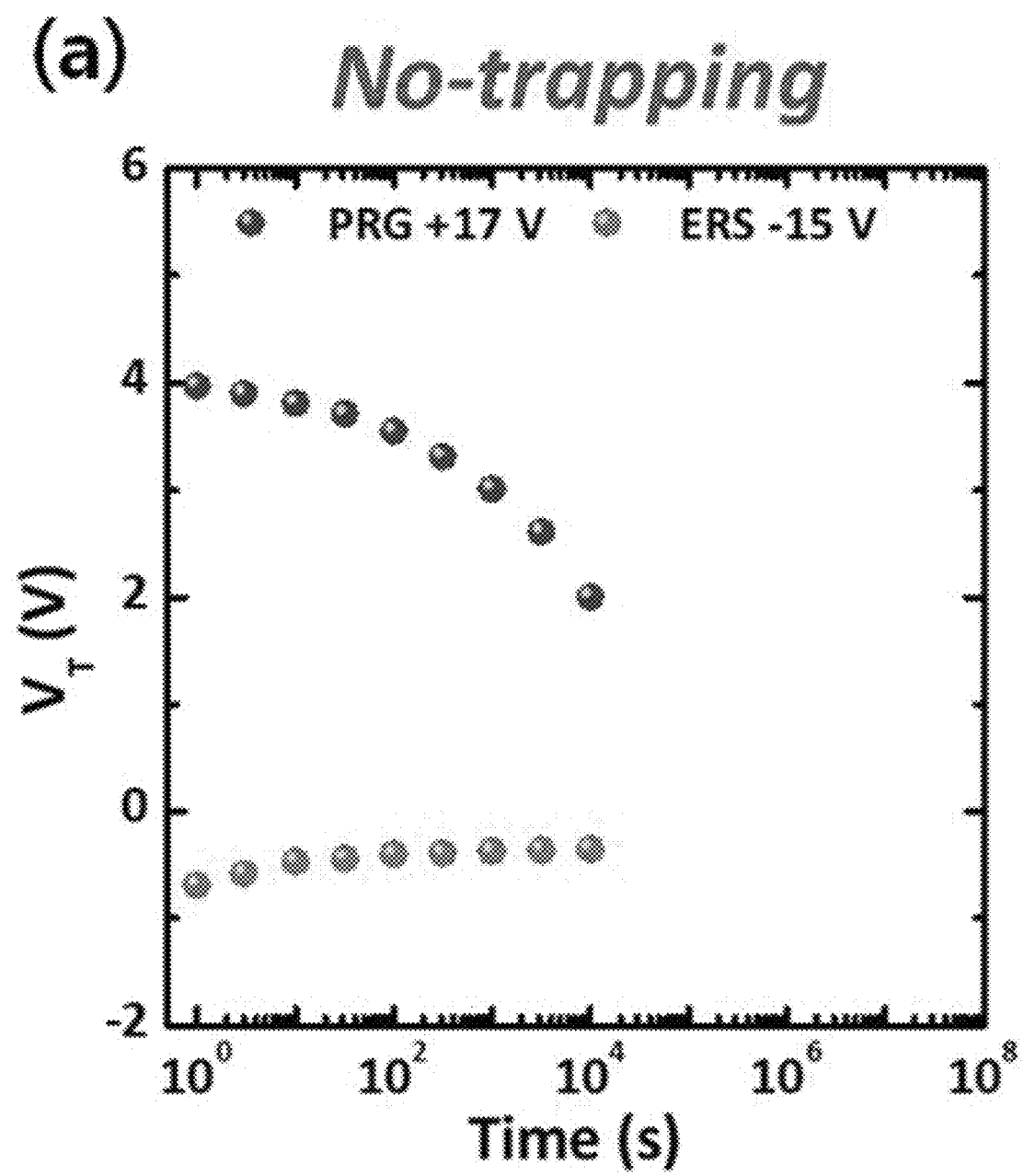
FIGS. 4A to 4D are diagrams illustrating measurement of a memory window change with time of the charge trapping non-volatile organic memory device manufactured according to an embodiment of the present invention.
Figure 4B:
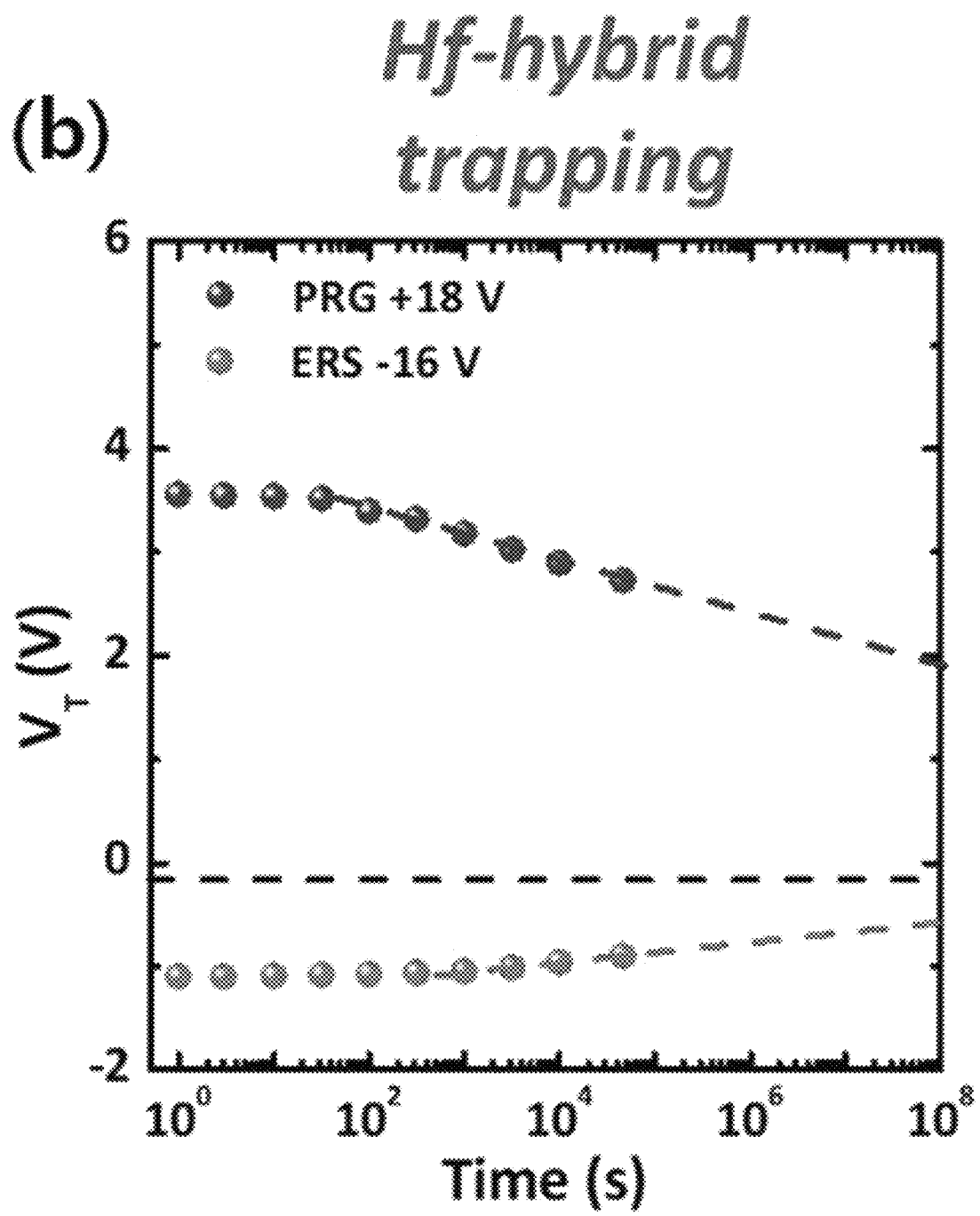
Figure 4C:
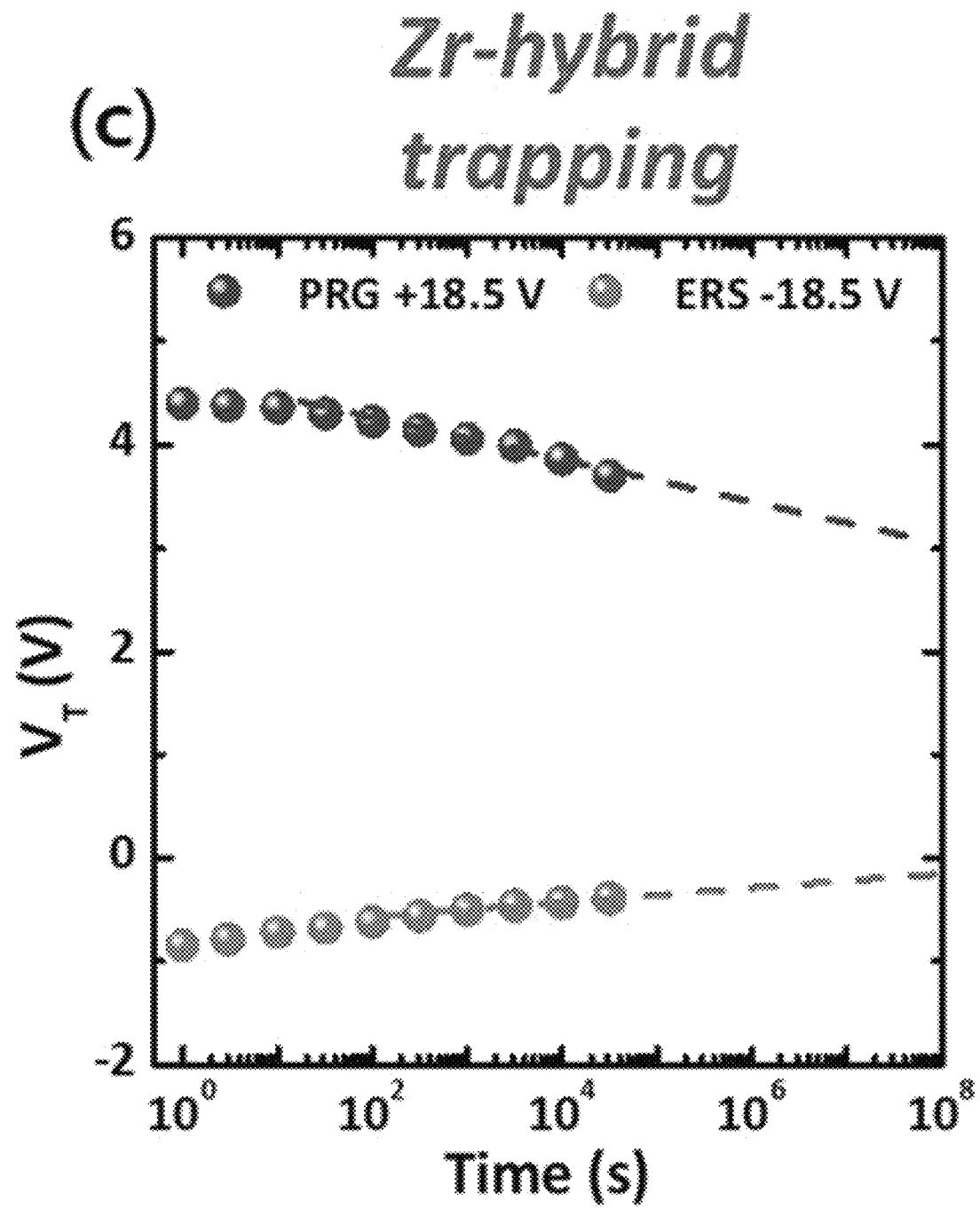
Figure 4D:
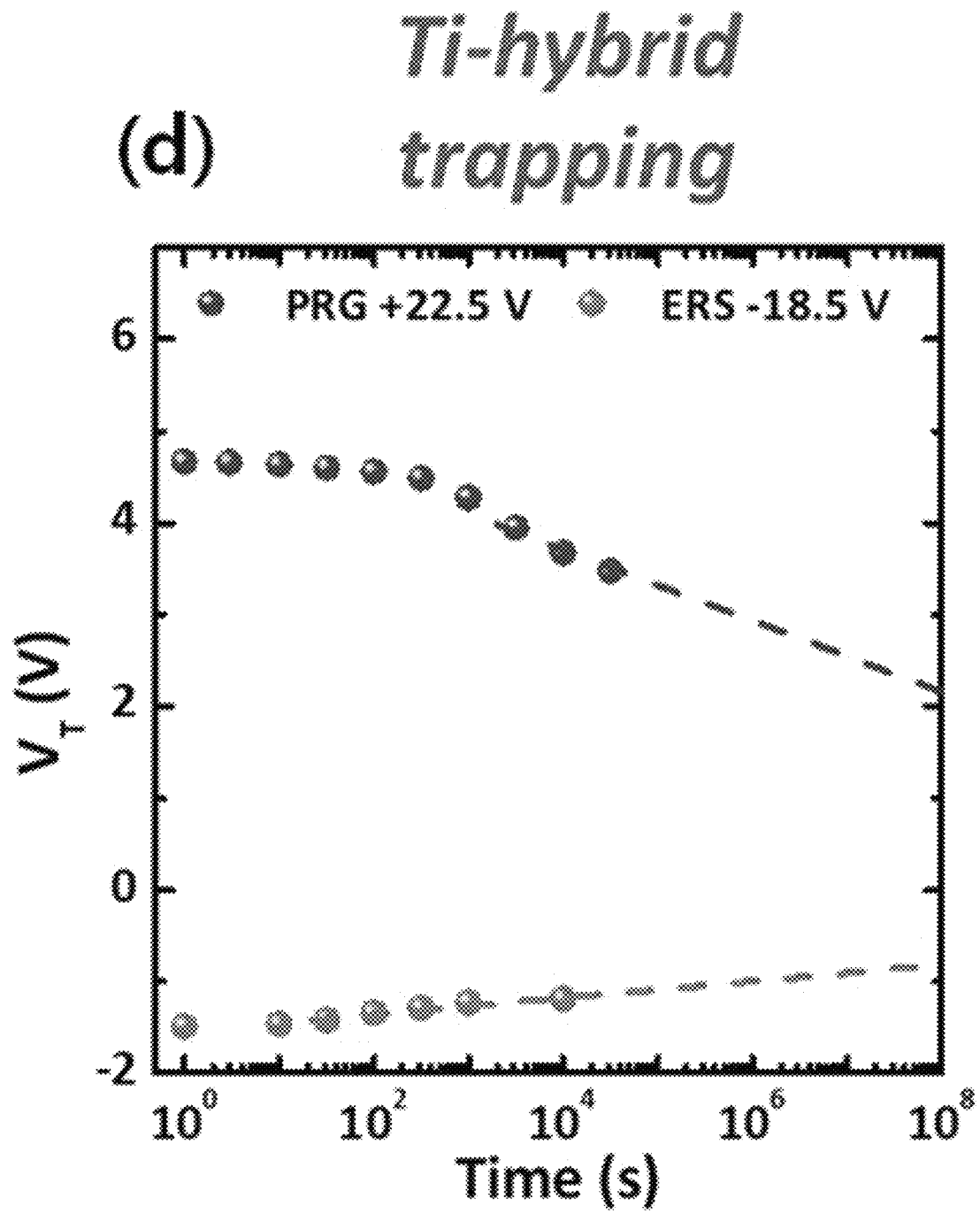

FIGS. 4A to 4D are diagrams illustrating measurement of the change in the memory window over time after programming (in the figure, indicated by a dark gray circle of the PRG, the program voltage indicated as the number V in the PRG of each figure) or erasing (in figure, indicated by a light gray circle of the ERS, the erase voltage indicated by the number V in the ERS) the non-volatile organic memory device (FIGS. 4B to 4D) and the double-layer memory device for comparison (FIGS. 4A to 4D) having the trapping layer, which is the organic-inorganic composite film into which hafnium oxide is introduced. In this case, the temperature was maintained at 300K. As can be seen from FIG. 4A, even in the case of the double-layer memory device, when it has a double-layer structure of the second organic-inorganic composite film to which aluminum oxide is introduced and a pV3D3 film, the memory characteristics appear due to the charge being trapped by the defects at the interface or the defects of the thin film itself, but since there is no electrical barrier, the memory characteristics are lost over time, and long-term reliability is not guaranteed. On the other hand, unlike the double-layer structure, in the case of the non-volatile organic memory device according to the embodiment, it can be seen that the charge trapped in the trapped layer by the electrical barrier is trapped without escaping, and thus, the non-volatile organic memory device has very good preservation. In detail, it can be seen that as illustrated in FIG. 4B, in the case of the non-volatile organic memory device having the first organic-inorganic composite film into which the hafnium oxide is introduced, the retention according to Equation 1 is 82.8%, and as illustrated in FIG. 4C, in the case of the non-volatile organic memory device having a first organic-inorganic composite film into which the zirconium oxide is introduced, the retention according to Equation 1 is 82.5%, and as illustrated in FIG. 4D, in the case of the non-volatile organic memory device provided with the first organic-inorganic composite film into which the titanium oxide is introduced, the retention according to Equation 1 is 88.0%, so the memory characteristics are stably maintained over time.

Figure 5:
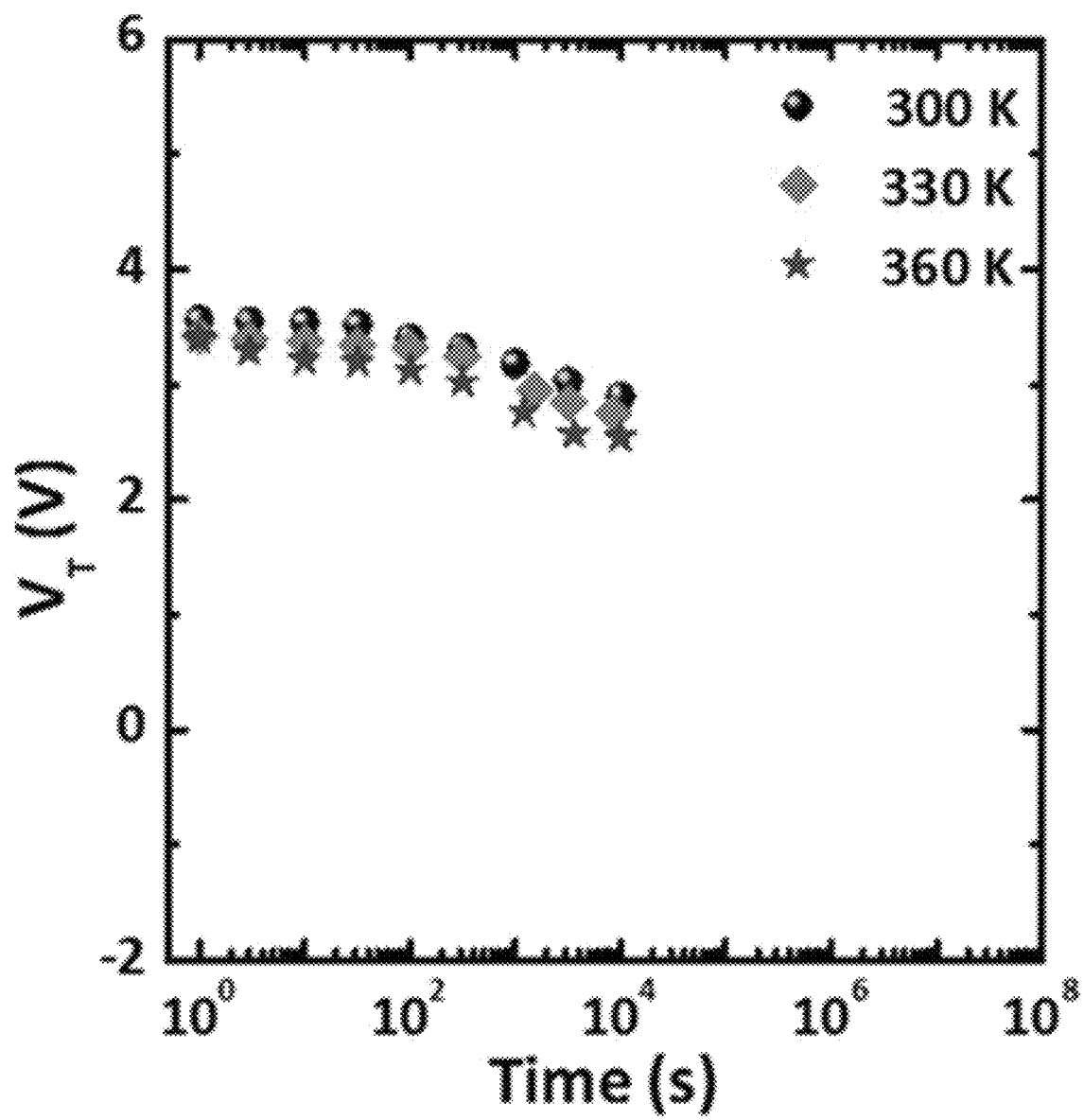
FIG. 5 is a diagram illustrating measurement of temperature reliability according to temperature of a charge trapping non-volatile organic memory device manufactured according to the embodiment of the present invention.

FIG. 5 is a diagram illustrating measurement of a change in memory characteristics over time at the same temperature (300K, 330K, or 360K) after the non-volatile organic memory device provided with the trapping layer, which is the organic-inorganic composite film into which the hafnium oxide is introduced, is set to be the initial threshold voltage at 300K (black circle in the figure), 330K (diamond in the figure), or 360K (star in the figure) by the ISPP method (program=18V, erase=−16V). According to Equation 2, $V_{Th}$(T2, 0)/$V_{Th}$(T1, 0)*100 was 95.5%, and according to Equation 3, ($V_{Th}$(T1, t)−($V_{Th}$(T2, t))/$V_{Th}$(T1, 0)*100 was 10.1%. It can be seen that even when the thermal emission is induced by raising the temperature, the memory characteristics are stably maintained without the charge moving from the trapping layer to the blocking layer or the tunneling layer due to the energy barrier, and it was confirmed that the I-V transfer curve according to the program/erase of 300K also exhibited substantially the same pattern in the range of 300K to 360K The non-volatile organic memory device having the first organic-inorganic composite film (trapping layer) into which the zirconium oxide or the titanium oxide is introduced also exhibited very good temperature reliability (thermal stability) as in the case in which the hafnium oxide was introduced.

Figure 6:
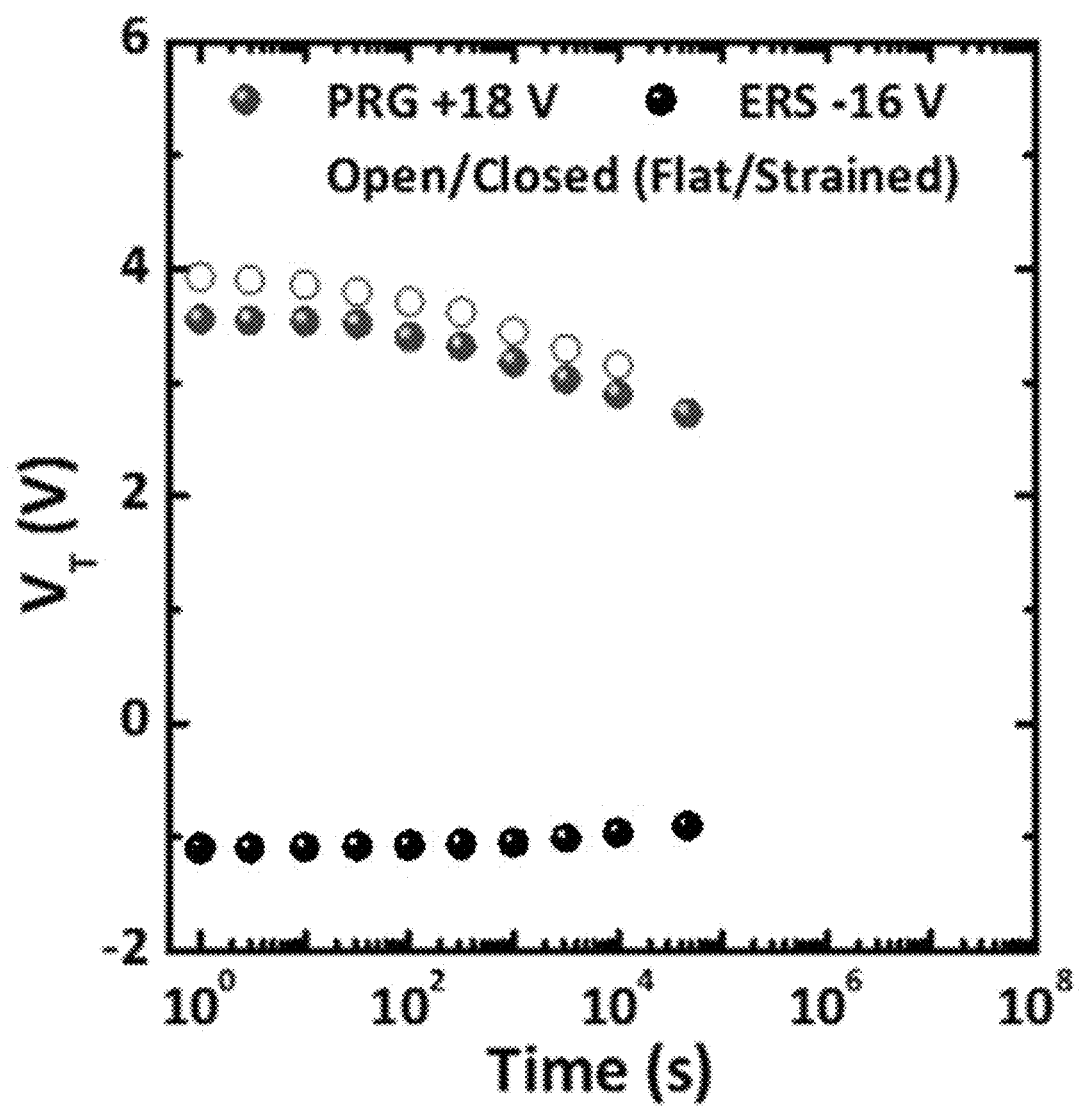
FIG. 6 is a diagram illustrating measurement of deformation reliability of the charge trapping non-volatile organic memory device manufactured according to the embodiment of the present invention.

FIG. 6 is a diagram illustrating measurement of the change in the memory characteristics over time in the 2% strain is maintained after the initial threshold value is set by the ISPP method (program=18V, erase=−16V) in a state (300K) applying 2% strain by bending the non-volatile organic memory device provided with the trapping layer which is the organic-inorganic composite film into which the hafnium oxide is introduced. In FIG. 6, the state to which the strain was applied is shown as a dark gray solid circle, and the undeformed state without applying the strain is shown as a dark gray hollow circle. According to Equation 4, $V_{Th}$(S, 0)/$V_{Th}$(0, 0)*100 was 90.6%, and according to Equation 5, ($V_{Th}$(0, t)−($V_{Th}$(S, t))/$V_{Th}$(0, 0)*100 was 7.0%. It was confirmed that even when the strain by the bending was applied, it had substantially the same I-V transfer curve as in the state in which the strain is not applied, and the long-term stability was also not significantly deteriorated by the applied strain. In the case of the non-volatile organic memory device provided with the first organic-inorganic composite film (trapping layer) in which the zirconium oxide or the titanium oxide is introduced, the deformation reliability similar to or superior to the case in which the hafnium oxide is introduced was exhibited.

Figure 7A:
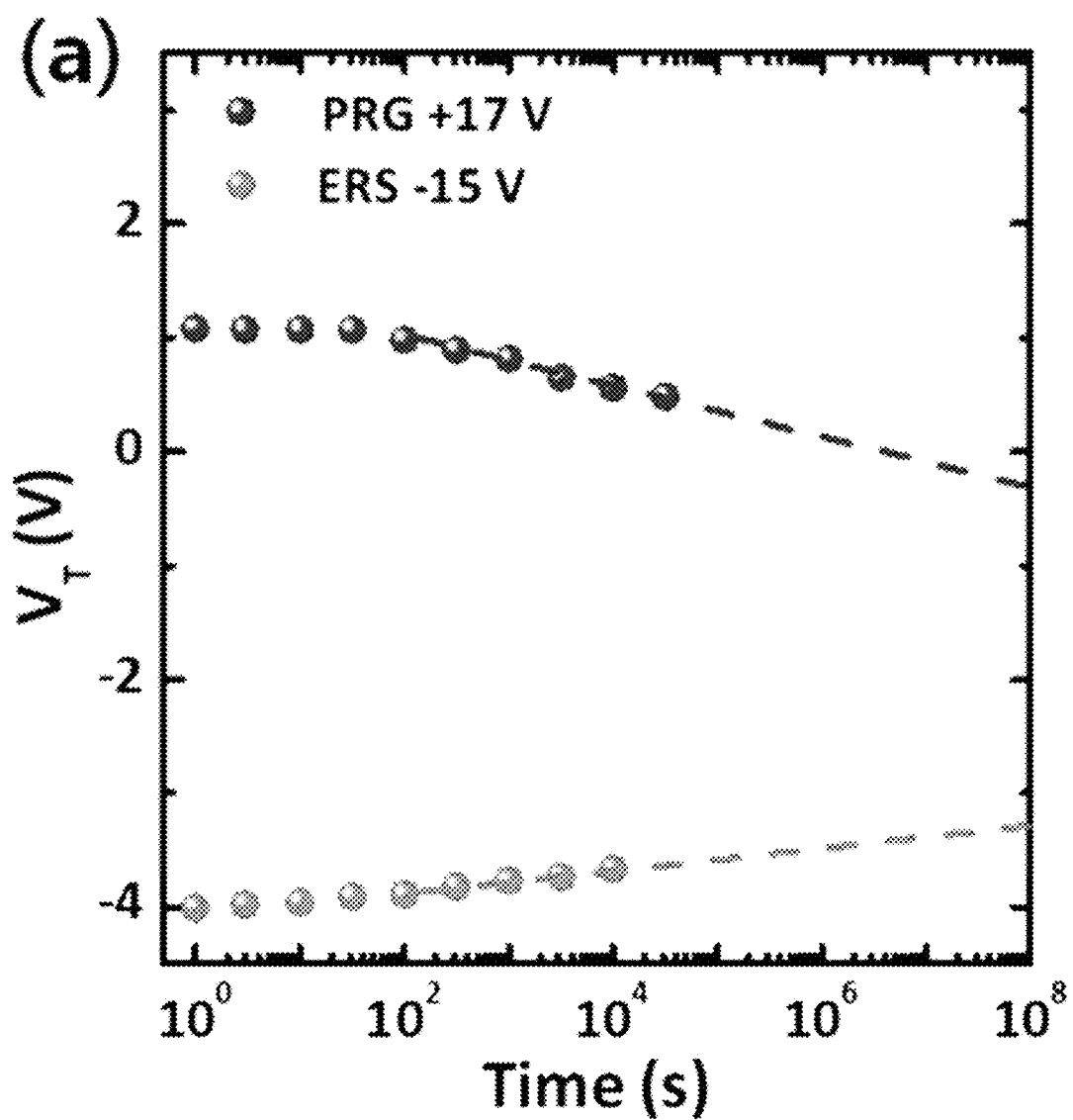
FIGS. 7A to 7C are diagrams illustrating measurement of retention, temperature reliability, and deformation reliability of a p-type organic semiconductor-based charge trapping non-volatile organic memory device manufactured according to an embodiment of the present invention.
Figure 7B:
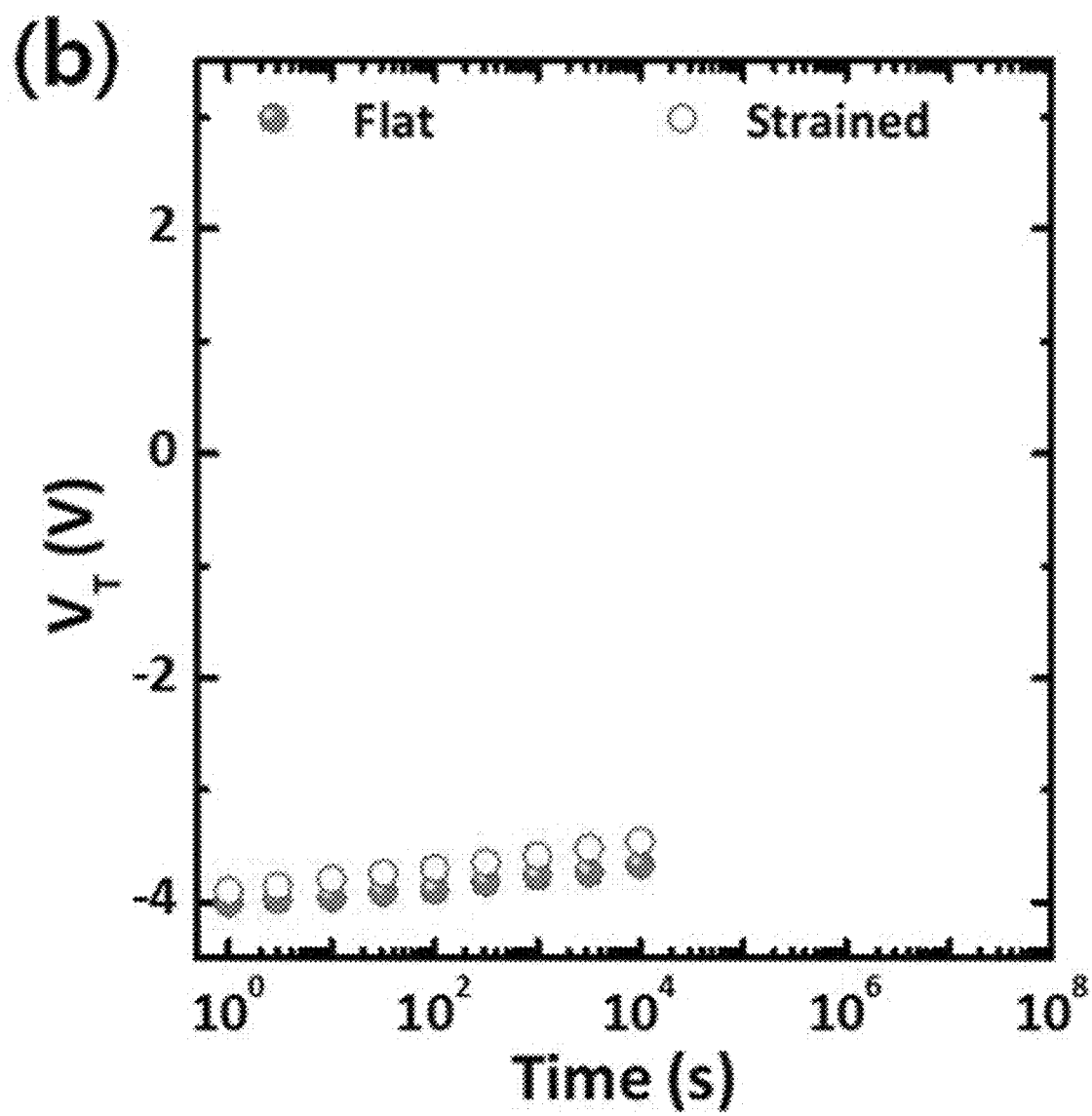
Figure 7C:
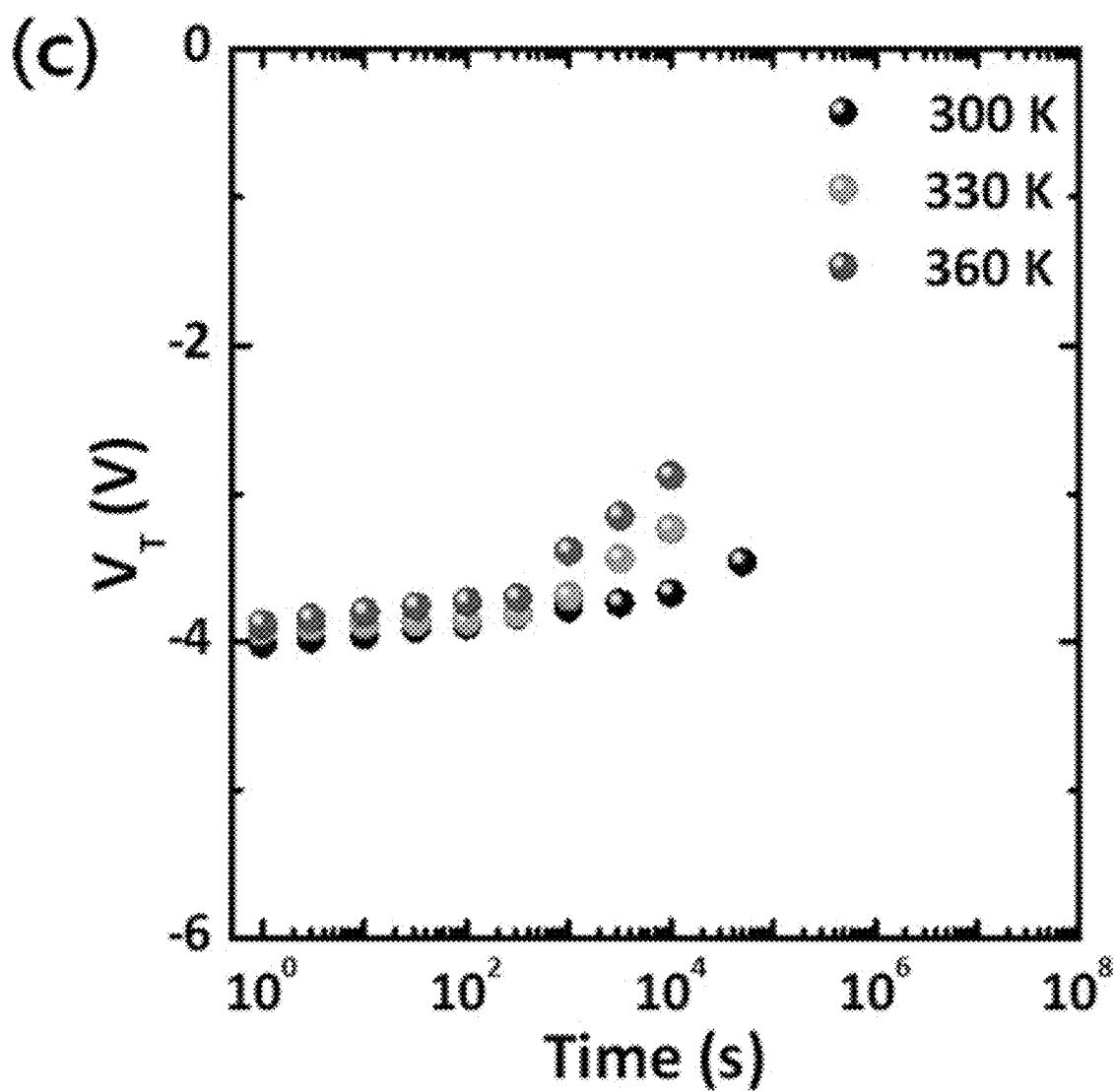

The results of FIGS. 3 to 6 are examples of PTCDI-C13 in which the organic semiconductor is an n-type semiconductor, but the present invention is not limited to the type of the organic semiconductor. FIGS. 7A to 7C illustrate the memory characteristics of the non-volatile organic memory device that includes pentacene, which is a p-type semiconductor, as an organic semiconductor, is provided and has the trapping layer, which is the organic-inorganic composite film into which the hafnium oxide is introduced. FIG. 7A is a diagram illustrating the change (dark gray circle program, program voltage=17V, light gray circle erase, erase voltage=−15V) in the memory window of the non-volatile organic memory device, FIG. 7B is a diagram illustrating the change in the threshold voltage under 2% strain (when flat strain is not applied, when strained 2% strain is applied), and FIG. 7C is a diagram illustrating the change (black circle: erase and maintain under 300K, light gray circle: erase and maintain under 330K, and dark gray circle: erase and maintain under 360K) in the threshold voltage according to the temperature. As can be seen from FIGS. 3A and 3B to FIGS. 7A to 7C, it can be seen that the trapping layer has very good retention, temperature reliability, and deformation reliability regardless of the type of charges trapped in the trapping layer.

Figure 8:
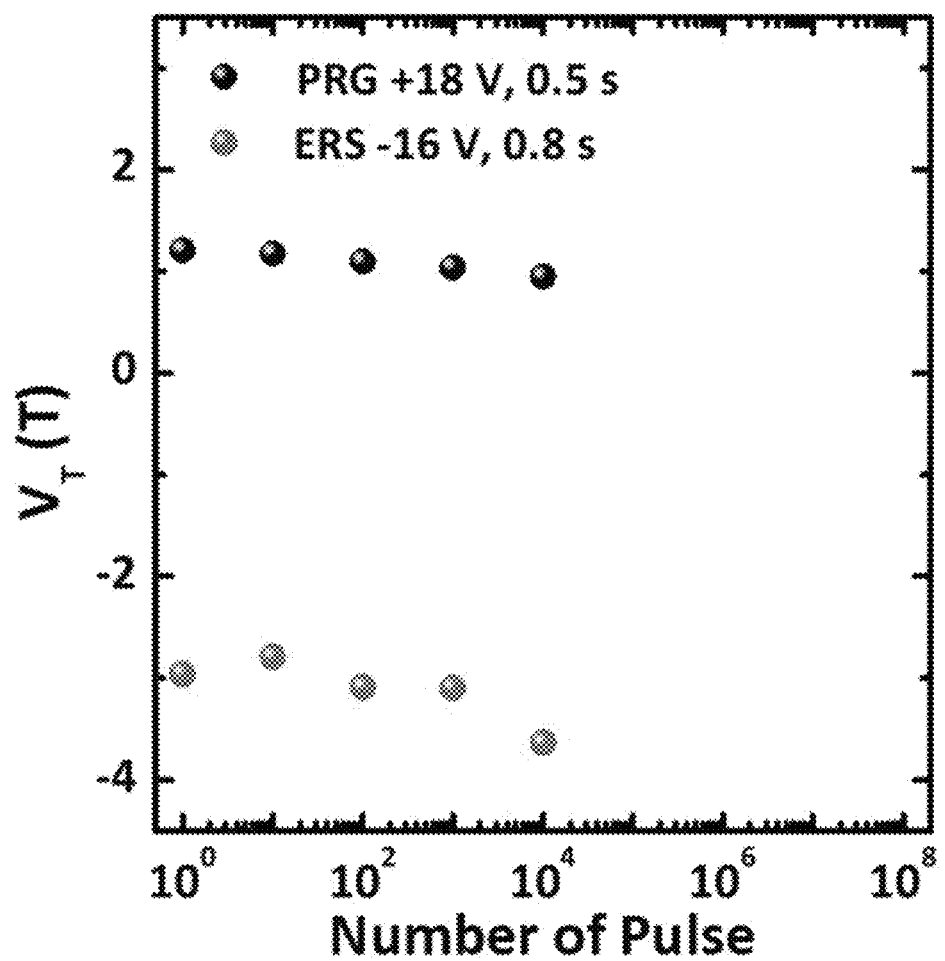
FIG. 8 is a diagram illustrating measurement of durability of the charge trapping non-volatile organic memory device manufactured according to the embodiment of the present invention.

FIG. 8 is a diagram illustrating measurement of durability of the non-volatile organic memory device that includes pentacene as a p-type semiconductor and has the trapping layer of the organic-inorganic composite film into which the hafnium oxide is introduced. The program was performed under the conditions of 18V and 0.5 s, the erase was performed under the conditions of −16V and 0.8 s, and the respective threshold voltages were shown at 100, 101, 103 and 104 with the number of program/erase repetitions. As can be seen from FIG. 8, it can be seen that even when the repetitive data storage and deletion are repeated up to 104, the deterioration of the memory characteristics hardly occurs.

Figure 9:
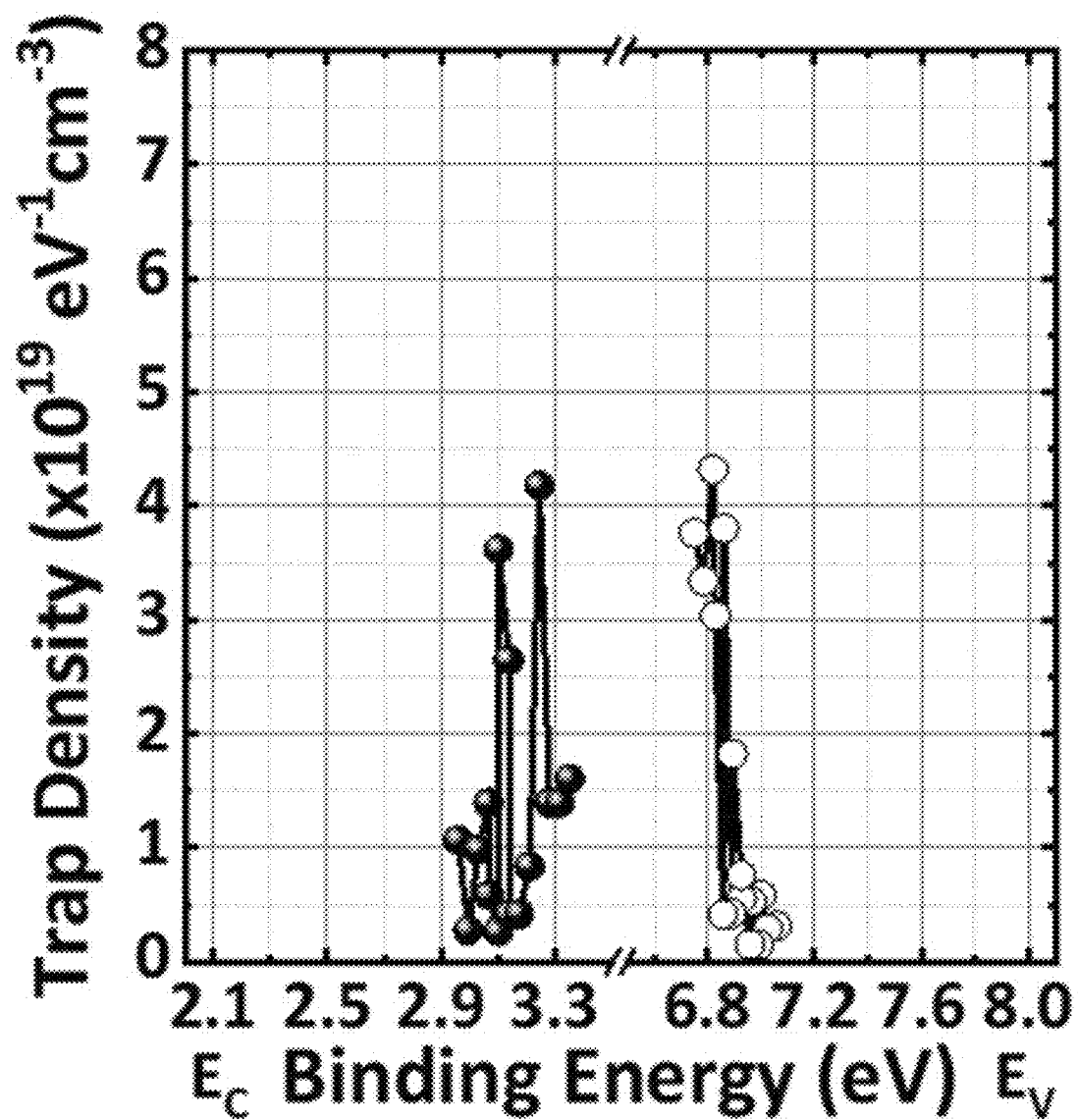
FIG. 9 is a diagram illustrating measurement of trap density according to binding energy of a trapping layer in the charge trapping non-volatile organic memory device manufactured according to an embodiment of the present invention.

FIG. 9 is a diagram illustrating measurement of trap density ($eV^{-1}$ $cm^{-3}$) according to binding energy of the organic-inorganic composite film (trapping layer) into which the hafnium oxide is introduced. As illustrated in FIG. 9, it was confirmed that the organic-inorganic composite film has a trap density of $10^{19}$ order $eV^{-1}$ $cm^{-3}$, and the organic-inorganic composite film into which the zirconium oxide or the titanium oxide was introduced also has a trap density of $10^{19}$ order $eV^{-1}$ $cm^{-3}$. As can be seen from FIG. 9, it can be seen that trap sites in the trapping layer of the organic-inorganic composite film are abundantly provided, which is advantageous for low power consumption and high-speed operation of the non-volatile organic memory.

A non-volatile organic memory device according to the present invention has a structure in which a blocking layer, a trapping layer, and a tunneling layer are sequentially positioned, the trapping layer including metal oxides and polymers, and has a film structure of an organic-inorganic complex in which the metal oxides are dispersed in a polymer matrix in units of atoms, and metals are bonded to the polymers via oxygen. An organic-inorganic complex in which metal oxides are dispersed in units of atoms and chemically bonded to polymers has the advantage that excellent long-term reliability is obtained since it is easy to control electrical characteristics such as a highest occupied molecular orbital (HOMO) energy level, a lowest unoccupied molecular orbital (LUMO) energy level, and bandgap energy to cause charges trapped in a trapping layer to be confined by an electrical energy barrier of a blocking layer and a tunneling layer, separate elements for isolation are not required due to low charge mobility in a horizontal direction, it is possible to form an extremely thin and uniform film of about 10 nm by a deposition process, it is possible to maximize trapping efficiency due to a high dielectric constant, and it is possible to implement a wide voltage window up to 6 V.

Hereinabove, although the present invention has been described by specific matters, exemplary embodiments, and the accompanying drawings, they have been provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to these exemplary embodiments, but the claims and all of modifications equal or equivalent to the claims are intended to fall within the scope and spirit of the present invention.

What is claimed is:

1. A charge trapping non-volatile organic memory device, comprising:
    an organic-inorganic composite film, in which a metal oxide is dispersed in a polymer matrix, as a trapping layer for trapping charges,
        wherein the charge trapping non-volatile organic memory device has retention satisfying the following Equation 1

$$70\% \leq MW(t)/MW(0)*100$$

wherein, in Equation 1, MW(0) is an initial memory window (V) of the charge trapping nonvolatile organic memory device under 300K, and MW(t) is a memory window at $10^4$ sec.

2. The charge trapping non-volatile organic memory device of claim 1, wherein in the organic-inorganic composite film, metal of the metal oxide is bonded to the polymer via oxygen, and dispersed in units of atoms.

3. The charge trapping non-volatile organic memory device of claim 1, further comprising:
    a stacked structure in which an organic blocking layer, the trapping layer, an organic-based tunneling layer, and an organic semiconductor layer are sequentially stacked.

4. The charge trapping non-volatile organic memory device of claim 3, further comprising:
    a source, a drain, and an upper gate formed on the organic semiconductor layer; and a lower gate formed under the blocking layer.

5. The charge trapping non-volatile organic memory device of claim 3, wherein in an energy band diagram with an energy level (eV) of electron in a vacuum as a reference (0 eV), a lowest unoccupied molecular orbital (LUMO) energy level of the blocking layer and a LUMO energy level of the tunneling layer are each higher than that of the trapping layer.

6. The charge trapping non-volatile organic memory device of claim 5, wherein in the energy band diagram, a highest occupied molecular orbital (HOMO) energy level of the blocking layer and a HOMO energy level of the tunneling layer are each lower than that of the trapping layer.

7. The charge trapping non-volatile organic memory device of claim 5, wherein a difference between the LUMO energy level of the blocking layer or the LUMO energy level of the tunneling layer and the LUMO energy level of the trapping layer is 0.5 eV or higher.

8. The charge trapping non-volatile organic memory device of claim 5, wherein a difference between the smaller one which is selected from the bandgap energy of the blocking layer and the bandgap energy of the tunneling layer, and the bandgap energy of the trapping layer is 1.0 eV or higher.

9. The charge trapping non-volatile organic memory device of claim 3, wherein the blocking layer is a second organic-inorganic composite film in which a second metal oxide is dispersed in a second polymer matrix.

10. The charge trapping non-volatile organic memory device of claim 9, wherein a dielectric constant of the blocking layer is 1.5 to 6 times that of the tunneling layer.

11. The charge trapping non-volatile organic memory device of claim 3, wherein a dielectric constant of the trapping layer is greater than that of the tunneling layer.

12. The charge trapping non-volatile organic memory device of claim 1, wherein the charge trapping non-volatile organic memory device satisfies the following Equations 2 and 3:

$$90\% \leq VTh(T2,0)/VTh(T1,0)*100 \qquad [\text{Equation 2}]$$

wherein, in Equation 2, VTh(T1, 0) is an initial threshold voltage at which the charge trapping nonvolatile organic memory device is programmed under 300K, and VTh(T2, 0) is an initial threshold voltage at which the charge trapping nonvolatile organic memory device is programmed under 360K;

$$(VTh(T1,t)-(VTh(T2,t))/VTh(T1,0)*100 \leq 20\% \qquad [\text{Equation 3}]$$

wherein, in Equation 3, VTh(T1, 0) is the same as the definition of Equation 2, VTh(T1, t) is a threshold voltage at $10^4$ sec under 300K of the charge trapping non-volatile organic memory device programmed with VTh(T1, 0), and VTh(T2, t) is a threshold voltage at $10^4$ sec under 360K of the charge trapping non-volatile organic memory device programmed with VTh(T2, 0) in Equation 2.

13. The charge trapping non-volatile organic memory device of claim 1, wherein the charge trapping non-volatile organic memory device has deformation reliability satisfying the following Equations 4 and 5:

$$85\% \leq VTh(S,0))/VTh(0,0)*100 \qquad [\text{Equation 4}]$$

wherein, in Equation 4, VTh(0, 0) is an initial threshold voltage, at which the charge trapping non-volatile organic memory device is programmed, under 300K and 0% strain, and VTh(S, 0) is an initial threshold voltage, at which the charge trapping non-volatile organic memory device is programmed, under 300K and 2% strain:

$$VTh(0,t)-(VTh(S,t))/VTh(0,0)*100 \leq 20\% \qquad [\text{Equation 5}]$$

wherein, in Equation 5, VTh(0, 0) is the same as the definition of Equation 4, VTh(0, t) is a threshold voltage at $10^4$ sec under 300K and 0% strain of the charge trapping nonvolatile organic memory device programmed with VTh (0, 0), and VTh(S, t) is a threshold voltage at $10^4$ sec under 300K and 2% strain of the charge trapping non-volatile organic memory device programmed with VTh(S, 0) in Equation 4.

14. The charge trapping non-volatile organic memory device of claim 1, wherein in the organic-inorganic composite, electrical properties including a HOMO energy level, a LUMO energy level, and bandgap energy and physical properties including a dielectric constant of the trapping layer are controlled by a content of the metal oxide.

15. The charge trapping non-volatile organic memory device of claim 1, wherein the metal of the metal oxide is one or two or higher selected from hafnium, titanium, and zirconium.

16. The charge trapping non-volatile organic memory device of claim 9, wherein the metal of the second metal oxide includes aluminum.

* * * * *